US009627229B2

(12) United States Patent
Lan et al.

(10) Patent No.: US 9,627,229 B2
(45) Date of Patent: Apr. 18, 2017

(54) SEMICONDUCTOR DEVICE AND METHOD OF FORMING TRENCH AND DISPOSING SEMICONDUCTOR DIE OVER SUBSTRATE TO CONTROL OUTWARD FLOW OF UNDERFILL MATERIAL

(71) Applicant: STATS ChipPAC, Ltd., Singapore (SG)

(72) Inventors: Hoang Lan, Qinpu District (CN); Wang Zhenliang, Qinpu District (CN)

(73) Assignee: STATS ChipPAC Pte. Ltd., Singapore (SG)

( * ) Notice: Subject to any disclaimer, the term of this patent is extended or adjusted under 35 U.S.C. 154(b) by 61 days.

(21) Appl. No.: 13/929,485

(22) Filed: Jun. 27, 2013

(65) Prior Publication Data

US 2015/0001729 A1    Jan. 1, 2015

(51) Int. Cl.
*H01L 21/31* (2006.01)
*H01L 21/56* (2006.01)
(Continued)

(52) U.S. Cl.
CPC ............ *H01L 21/563* (2013.01); *H01L 23/13* (2013.01); *H01L 23/49816* (2013.01); *H01L 23/49827* (2013.01); *H01L 25/0655* (2013.01); *H01L 23/16* (2013.01); *H01L 23/18* (2013.01); *H01L 23/31* (2013.01); *H01L 23/3121* (2013.01); *H01L 23/3142* (2013.01); *H01L 31/0203* (2013.01); *H01L 31/0216* (2013.01); *H01L 33/483* (2013.01); *H01L 33/486* (2013.01); *H01L 2224/0401* (2013.01);
(Continued)

(58) Field of Classification Search
CPC ..... H01L 23/563; H01L 23/31; H01L 21/563; H01L 203/16; H01L 203/18; H01L 203/31; H01L 203/3142; H01L 23/13; H01L 23/16; H01L 23/18; H01L 23/3142; H01L 2924/15151; H01L 33/483; H01L 33/486; H01L 31/0203; H01L 31/0216
USPC ...................... 438/124, 126, 127, 51, 55, 65
See application file for complete search history.

(56) References Cited

U.S. PATENT DOCUMENTS 4,814,943 A * 3/1989 Okuaki ................... H01L 23/04
                                                                      174/564
5,120,678 A * 6/1992 Moore et al. ................... 29/840
(Continued)

*Primary Examiner* — David Zarneke
(74) *Attorney, Agent, or Firm* — Robert D. Atkins; Patent Law Group: Atkins and Associates, P.C.

(57) ABSTRACT

A semiconductor device has a substrate including an opening. A trench is formed over the substrate around the opening. An interconnect structure is formed in the trench. An underfill material is disposed over the interconnect structure. A first semiconductor die is disposed over the underfill material prior to curing the underfill material. An active region of the first semiconductor die is disposed over the opening in the substrate. The trench contains the outward flow of underfill material. Underfill material is blocked from flowing over unintended areas on the surface of substrate, into the opening in the substrate, and over sensors of the first semiconductor die. A second semiconductor die is disposed over the substrate. The trench is formed by a first and second dam or a first insulating layer. A second insulating layer is formed over the first insulating layer. A dam is formed over the second insulating layer.

29 Claims, 23 Drawing Sheets

(51) Int. Cl.
  *H01L 23/16* (2006.01)
  *H01L 23/18* (2006.01)
  *H01L 23/31* (2006.01)
  *H01L 33/48* (2010.01)
  *H01L 31/0203* (2014.01)
  *H01L 31/0216* (2014.01)
  *H01L 23/13* (2006.01)
  *H01L 25/065* (2006.01)
  *H01L 23/498* (2006.01)

(52) U.S. Cl.
  CPC ........... *H01L 2224/16227* (2013.01); *H01L 2224/16237* (2013.01); *H01L 2224/26175* (2013.01); *H01L 2224/73204* (2013.01); *H01L 2224/81192* (2013.01); *H01L 2224/94* (2013.01); *H01L 2924/15151* (2013.01); *H01L 2924/15313* (2013.01)

(56) References Cited

U.S. PATENT DOCUMENTS

| | | | | |
|---|---|---|---|---|
| 5,218,234 A * | 6/1993 | Thompson et al. | | 257/787 |
| 5,766,982 A * | 6/1998 | Akram et al. | | 438/51 |
| 5,844,319 A * | 12/1998 | Gamota et al. | | 257/778 |
| 6,000,127 A * | 12/1999 | Eifuku | | H01L 21/563 257/E21.503 |
| 6,046,076 A | 4/2000 | Mitchell et al. | | 438/127 |
| 6,179,198 B1 * | 1/2001 | Eifuku | | B23K 1/0016 228/103 |
| 6,209,196 B1 * | 4/2001 | Ozono | | H01L 21/563 257/E21.503 |
| 6,291,264 B1 * | 9/2001 | Tang et al. | | 438/106 |
| 6,333,206 B1 * | 12/2001 | Ito | | C08L 63/00 257/686 |
| 6,351,390 B1 * | 2/2002 | Mayer | | G01L 19/0069 174/250 |
| 6,391,683 B1 * | 5/2002 | Chiu et al. | | 438/108 |
| 6,627,979 B2 * | 9/2003 | Park | | 257/667 |
| 6,762,509 B2 * | 7/2004 | Hilton et al. | | 257/787 |
| 6,853,089 B2 * | 2/2005 | Ujiie et al. | | 257/783 |
| 6,984,866 B1 * | 1/2006 | Mostafazadeh | | H01L 27/14618 257/433 |
| 7,015,592 B2 * | 3/2006 | Starkston et al. | | 257/787 |
| 7,122,893 B2 * | 10/2006 | Weng et al. | | 257/730 |
| 7,179,683 B2 * | 2/2007 | Low et al. | | 438/108 |
| 7,221,059 B2 * | 5/2007 | Farnworth et al. | | 257/778 |
| 7,338,842 B2 * | 3/2008 | Chaware et al. | | 438/127 |
| 7,863,727 B2 * | 1/2011 | Lake | | 257/698 |
| 7,880,276 B2 * | 2/2011 | Nishimura et al. | | 257/667 |
| 8,134,214 B2 * | 3/2012 | Baldo et al. | | 257/415 |
| 8,187,921 B2 * | 5/2012 | Yim et al. | | 438/109 |
| 8,399,300 B2 | 3/2013 | Lee et al. | | |
| 8,952,402 B2 * | 2/2015 | Vadhavkar | | H01L 33/62 257/88 |
| 2005/0104186 A1 * | 5/2005 | Yang | | H01L 27/14618 257/688 |
| 2006/0266938 A1 * | 11/2006 | Abela | | H01L 27/14618 250/239 |
| 2006/0281223 A1 * | 12/2006 | Liu et al. | | 438/108 |
| 2008/0036094 A1 * | 2/2008 | Yoneda | | H01L 21/563 257/774 |
| 2008/0310854 A1 * | 12/2008 | Takai | | G02B 6/423 398/139 |
| 2009/0189268 A1 * | 7/2009 | Kado | | H01L 23/3128 257/686 |
| 2009/0224386 A1 * | 9/2009 | Camacho et al. | | 257/680 |
| 2009/0250810 A1 * | 10/2009 | Pendse | | 257/723 |
| 2009/0278215 A1 * | 11/2009 | Baldo | | B81B 7/0061 257/415 |
| 2009/0294162 A1 * | 12/2009 | Jeong | | H01L 21/563 174/260 |
| 2010/0139962 A1 * | 6/2010 | Kaneko | | H01L 21/4857 174/260 |
| 2010/0155965 A1 * | 6/2010 | Igarashi | | 257/778 |
| 2010/0304536 A1 * | 12/2010 | Sumita | | 438/127 |
| 2011/0095421 A1 * | 4/2011 | Kim | | H01L 21/563 257/737 |
| 2011/0115083 A1 | 5/2011 | Zang et al. | | |
| 2011/0147912 A1 * | 6/2011 | Karpur | | H01L 21/563 257/687 |
| 2011/0275177 A1 * | 11/2011 | Yim et al. | | 438/108 |
| 2012/0088338 A1 * | 4/2012 | Lower et al. | | 438/127 |
| 2012/0127689 A1 * | 5/2012 | Mclellan et al. | | 361/820 |
| 2012/0153447 A1 * | 6/2012 | Jiang | | H01L 21/563 257/673 |
| 2012/0153462 A1 * | 6/2012 | Wakiyama | | 257/737 |
| 2013/0049039 A1 * | 2/2013 | Vadhavkar | | H01L 33/62 257/98 |
| 2014/0346673 A1 * | 11/2014 | Lin et al. | | 257/737 |

* cited by examiner

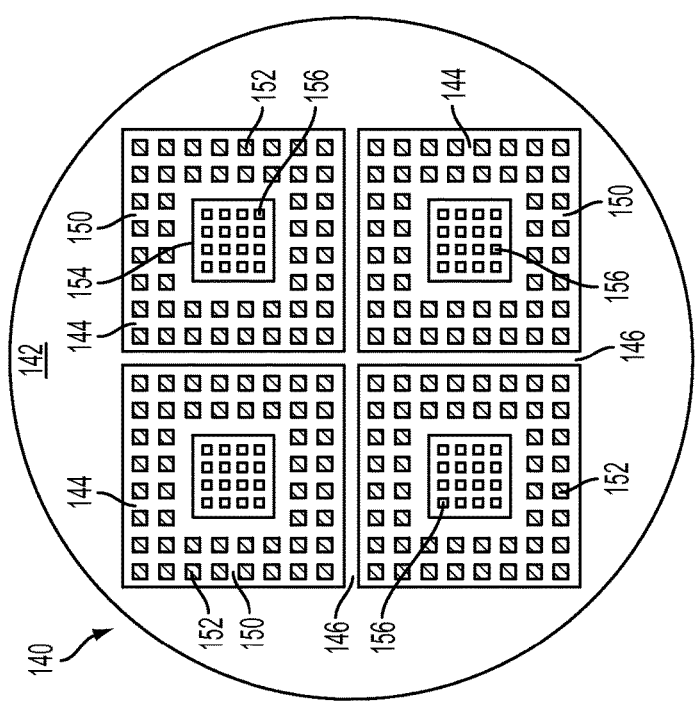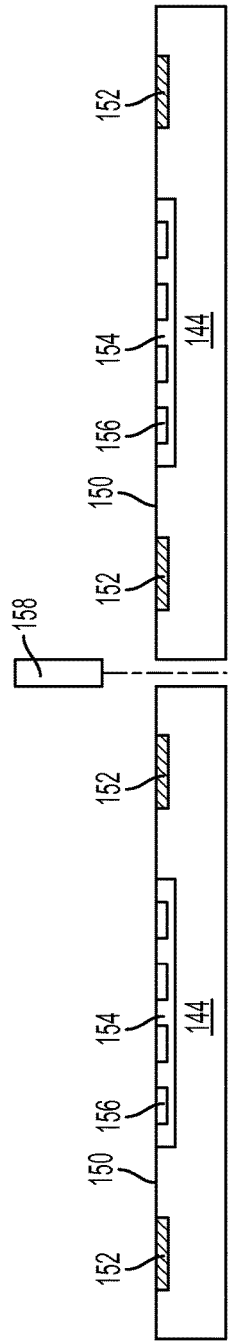

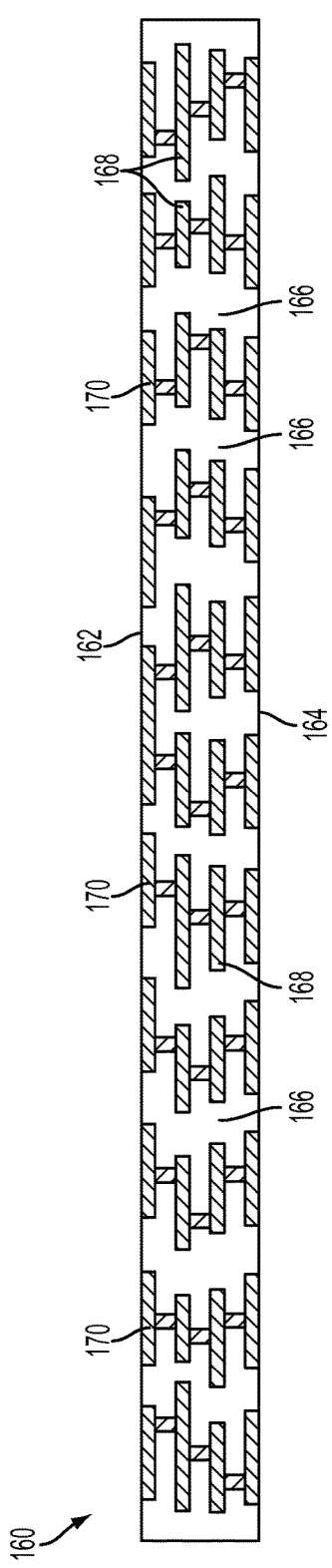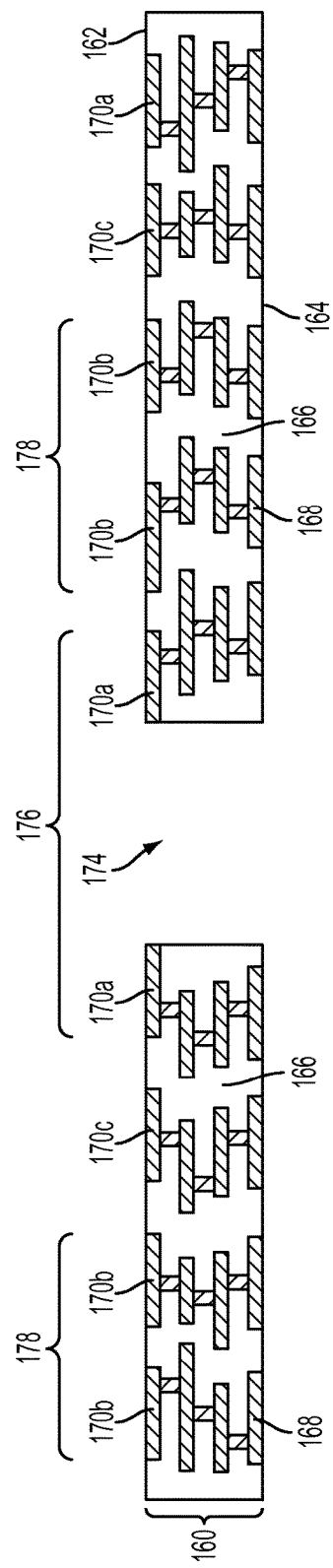

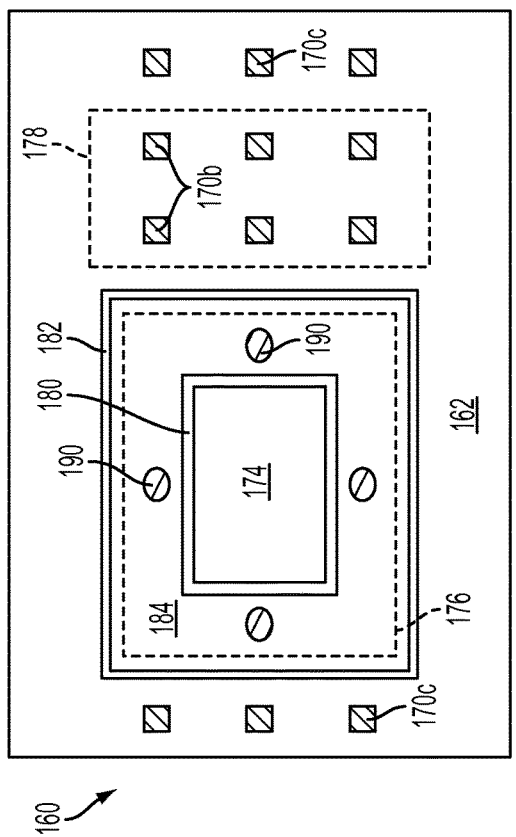
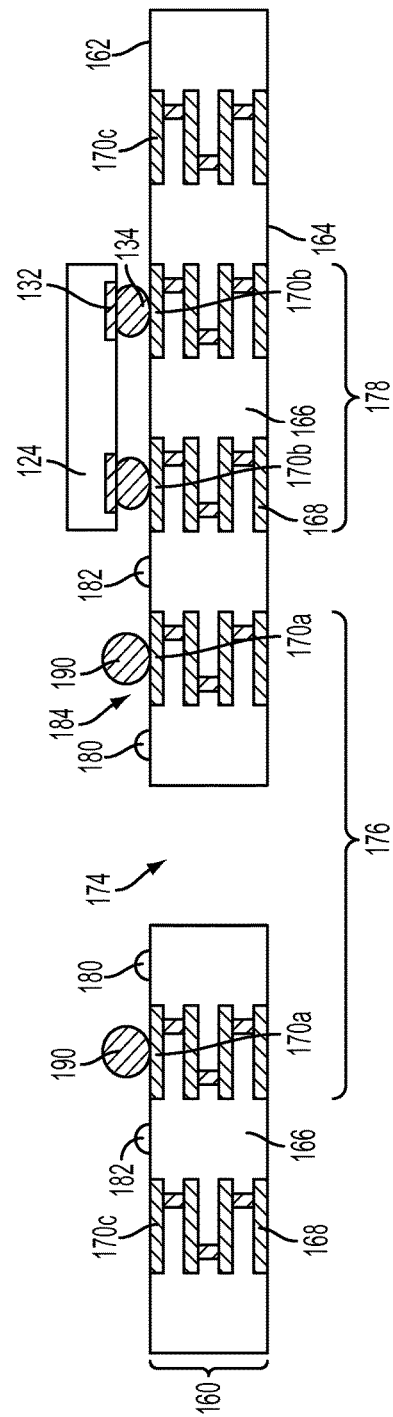

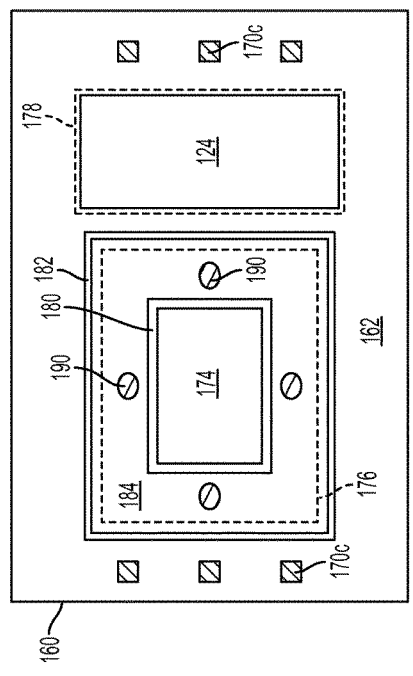
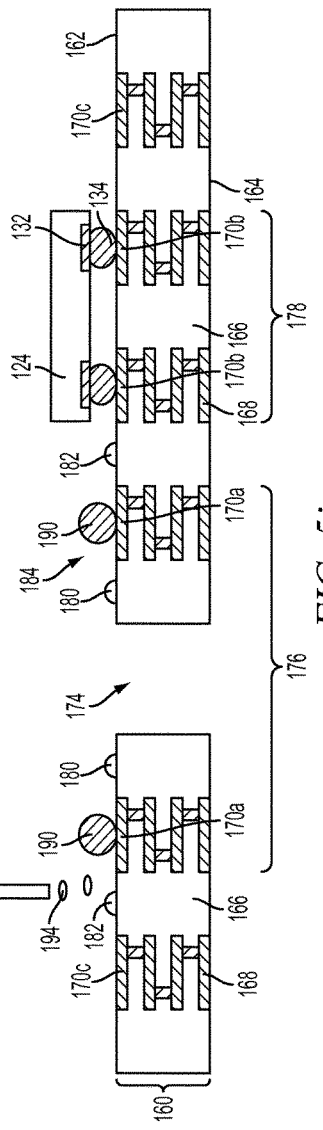
FIG. 5i
FIG. 5j

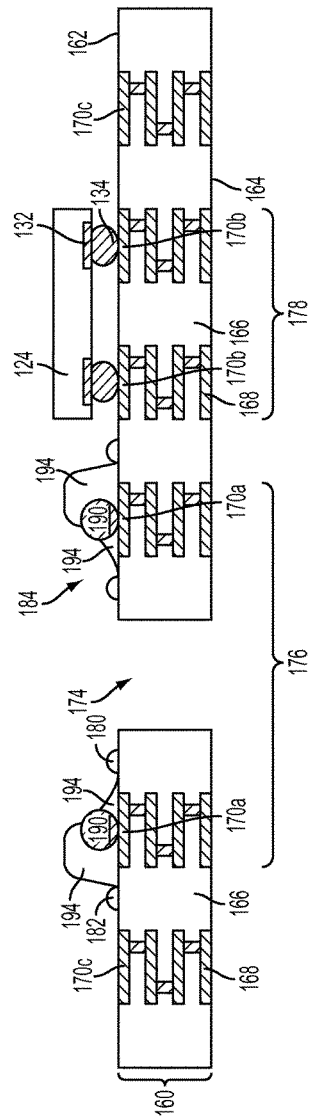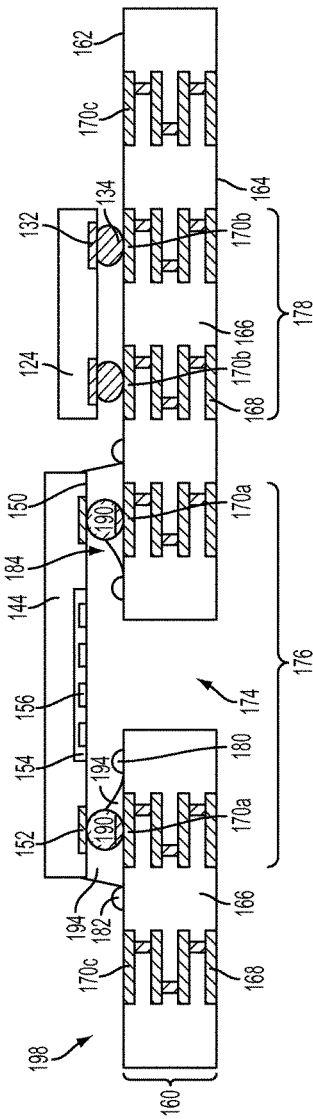

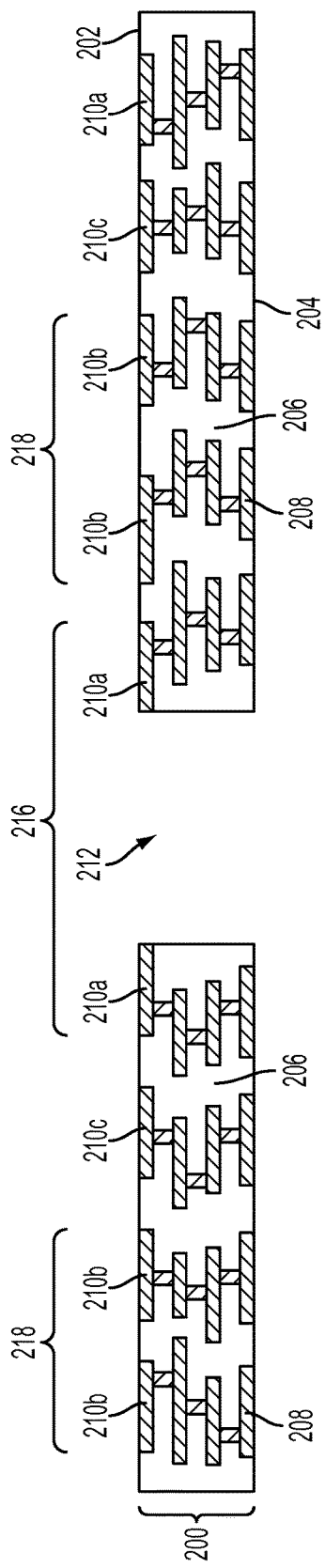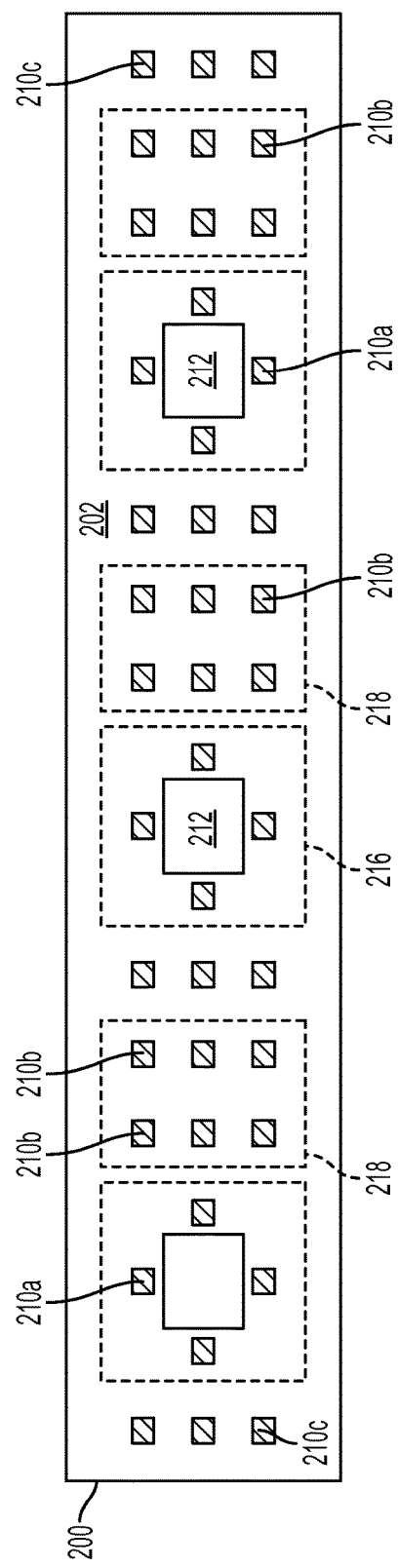
FIG. 6a
FIG. 6b

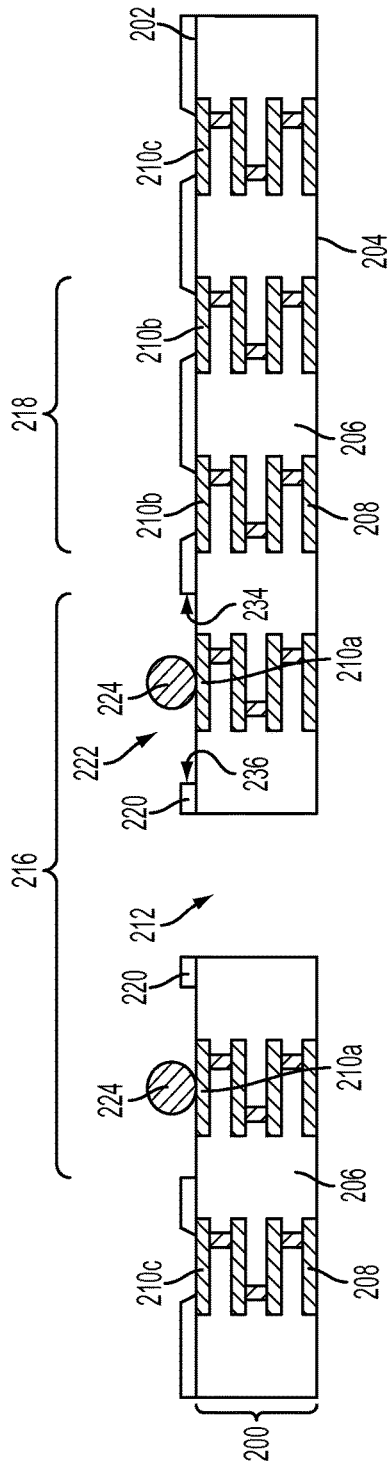
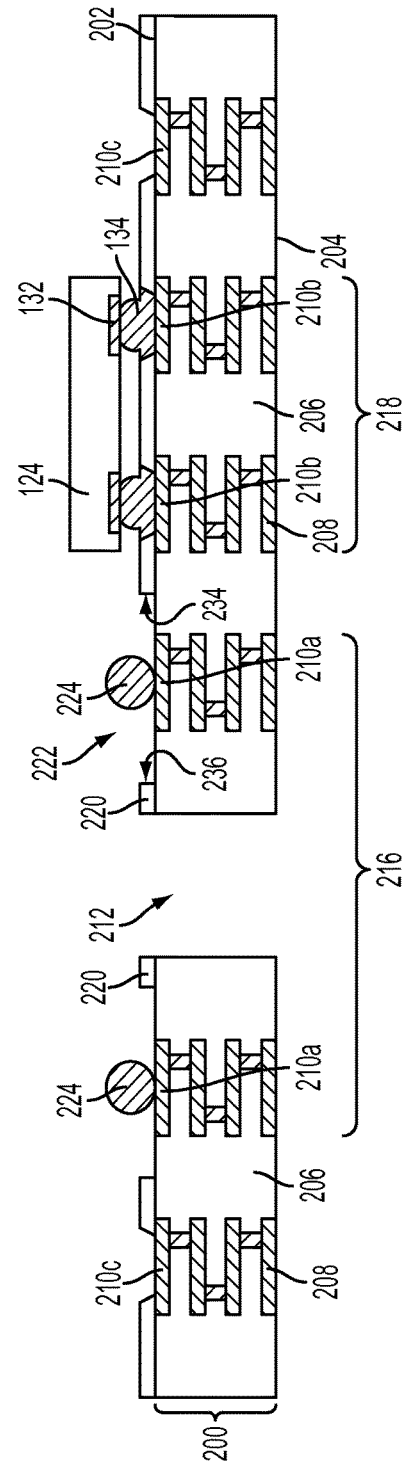
FIG. 6e
FIG. 6f

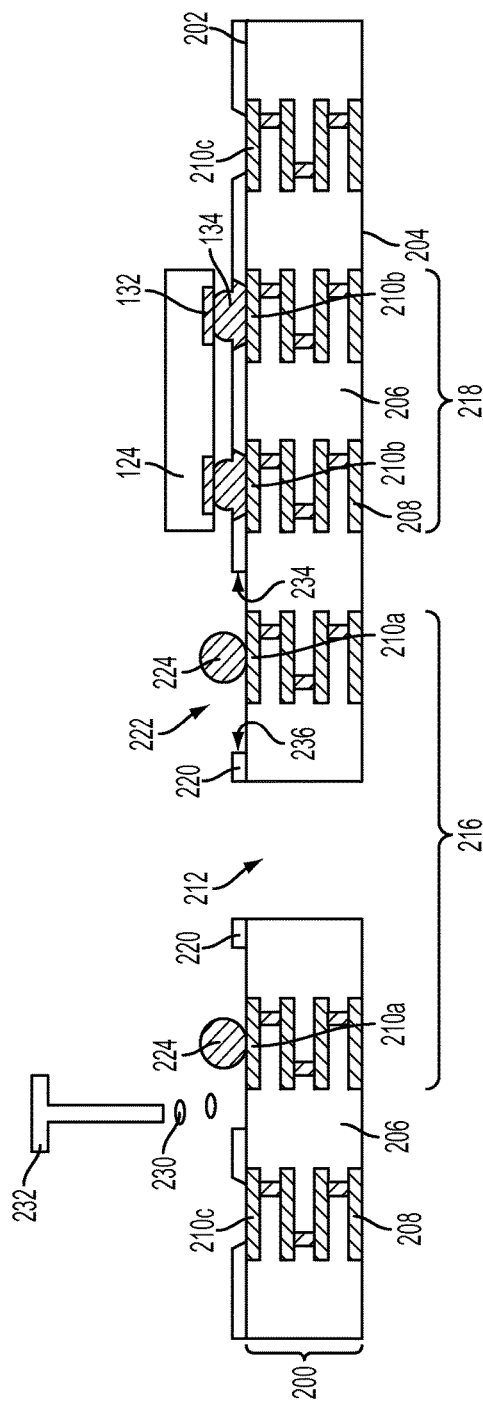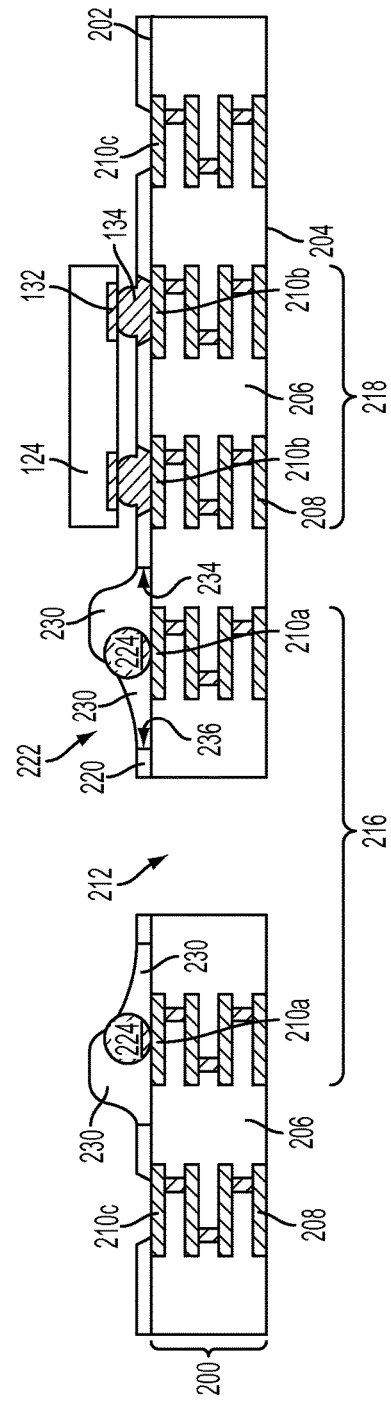

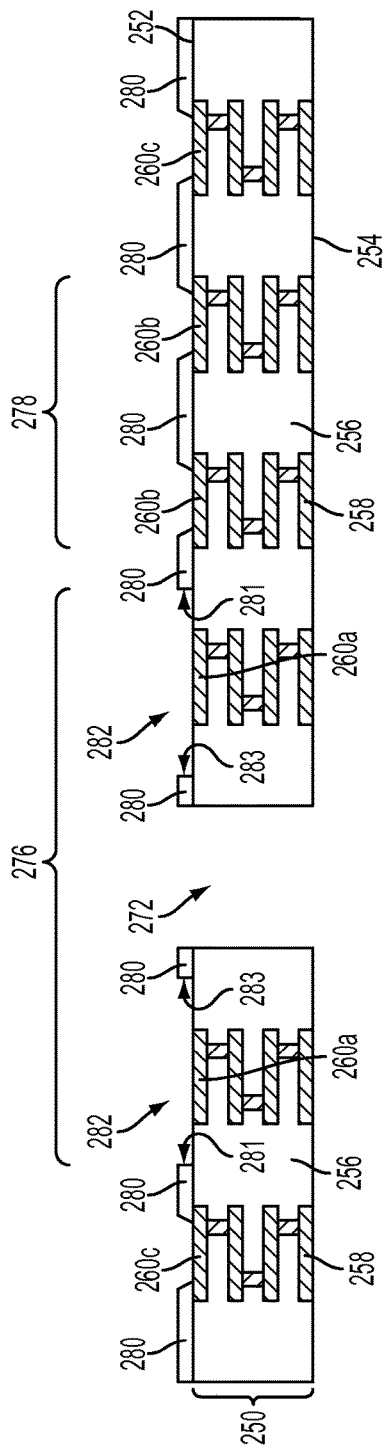
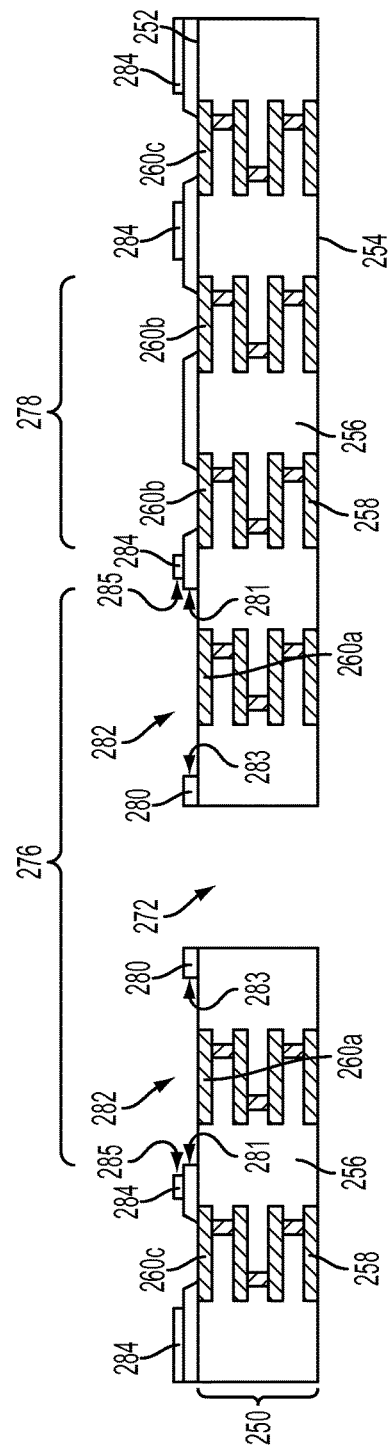
FIG. 7b
FIG. 7c

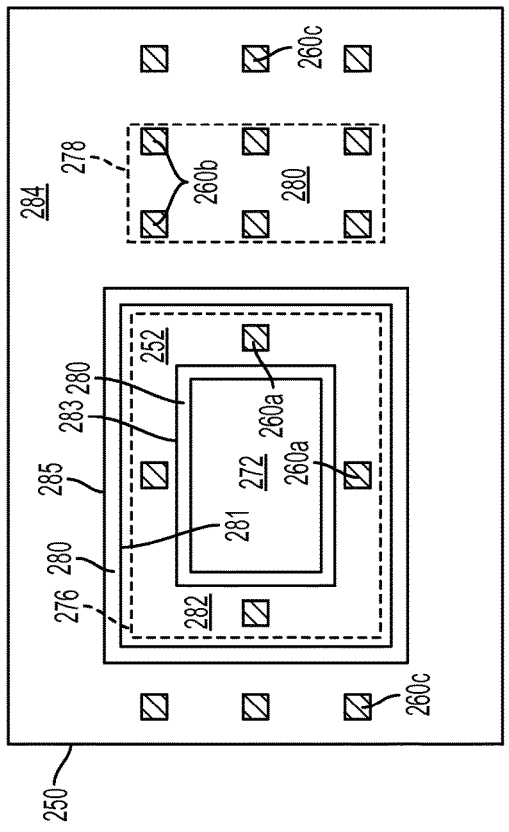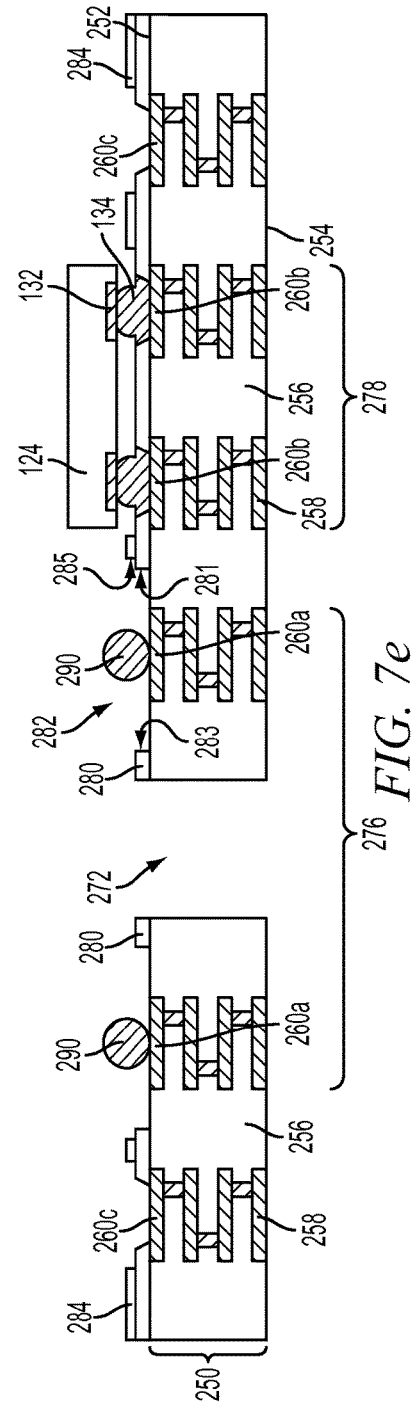
FIG. 7d
FIG. 7e

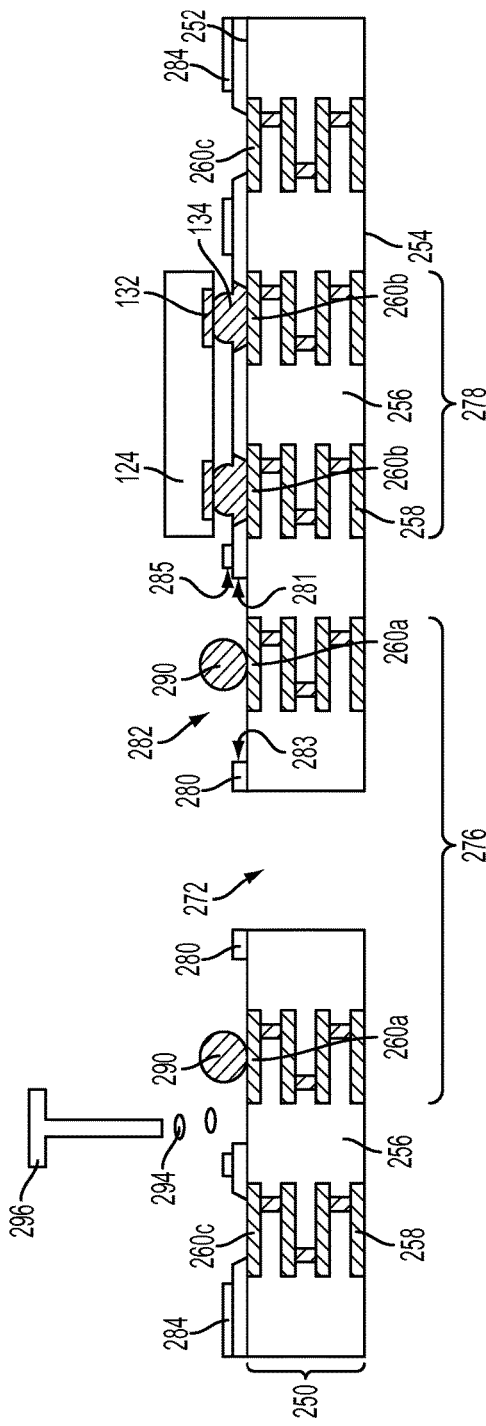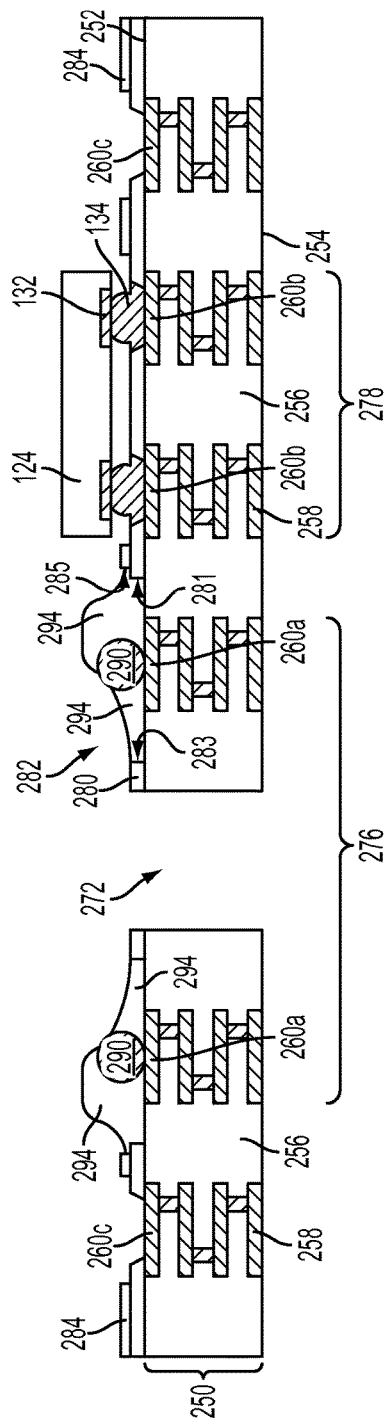
FIG. 7f
FIG. 7g

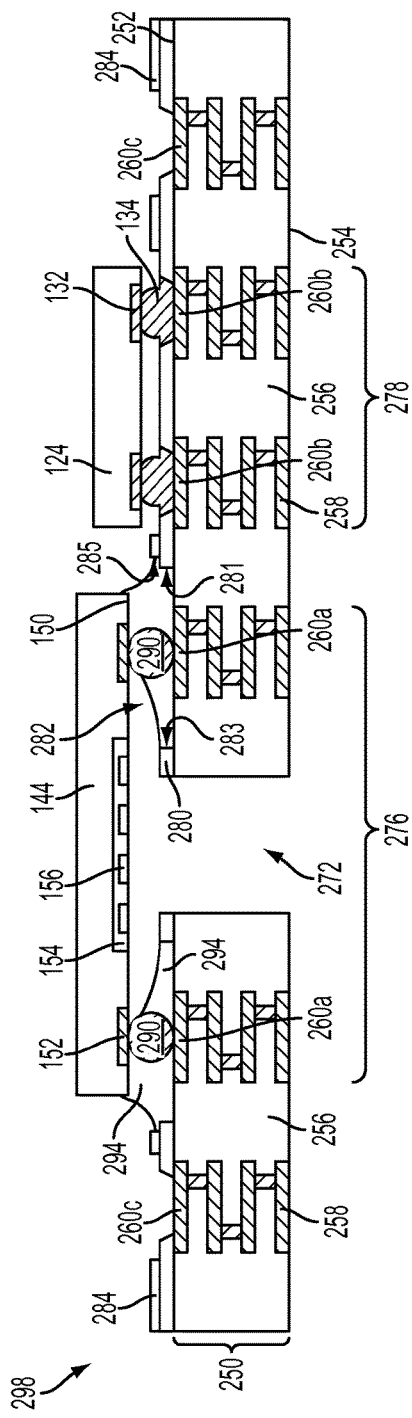
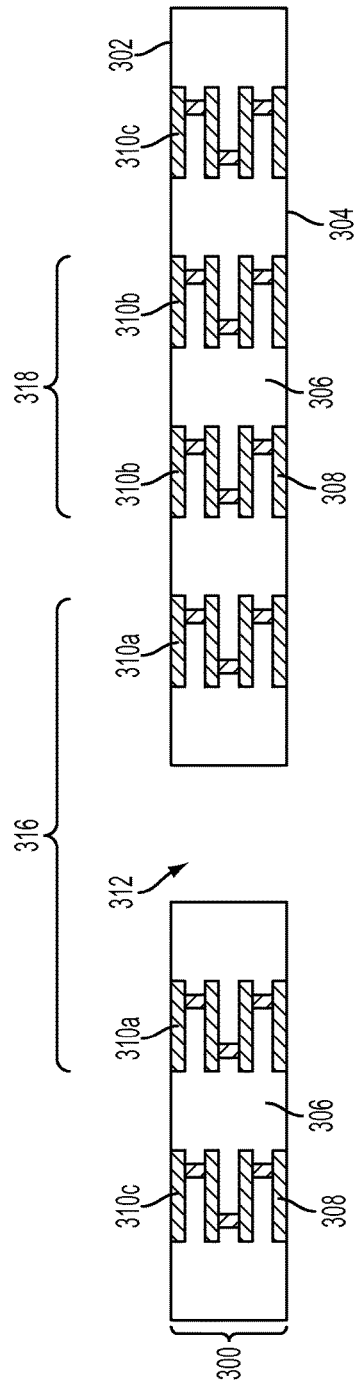
FIG. 7h
FIG. 8a

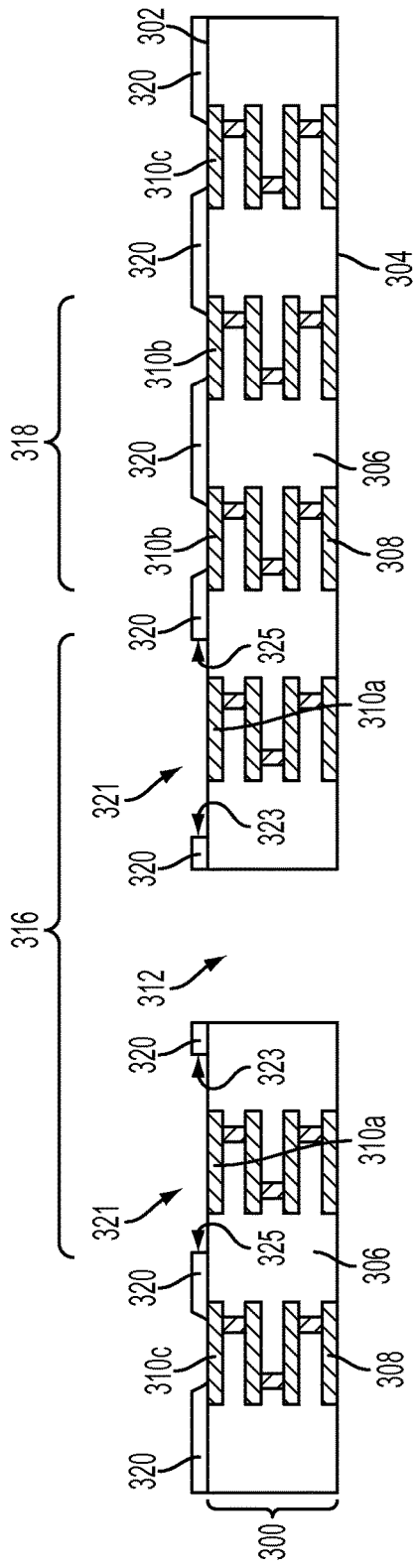
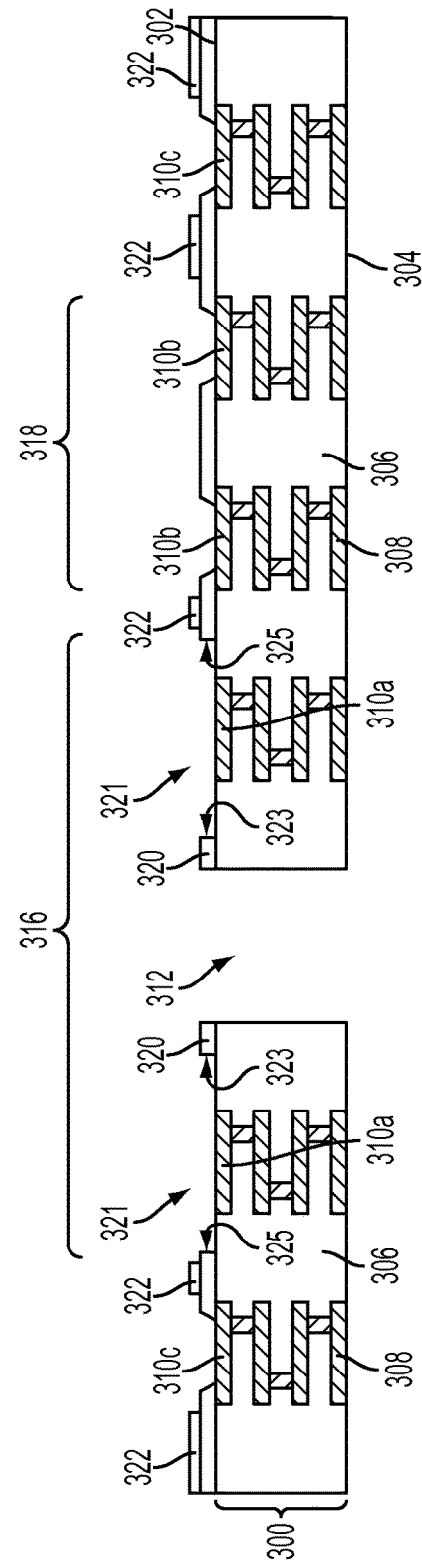
FIG. 8b
FIG. 8c

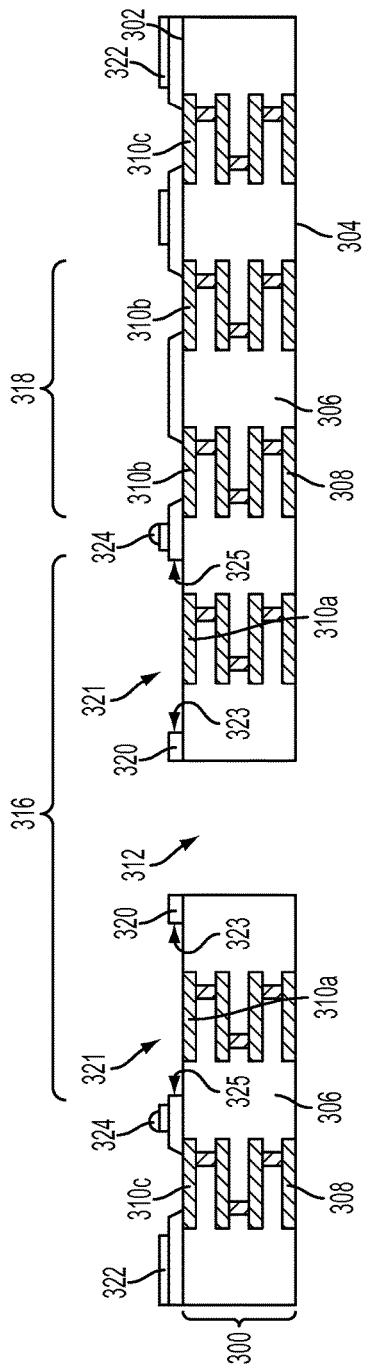
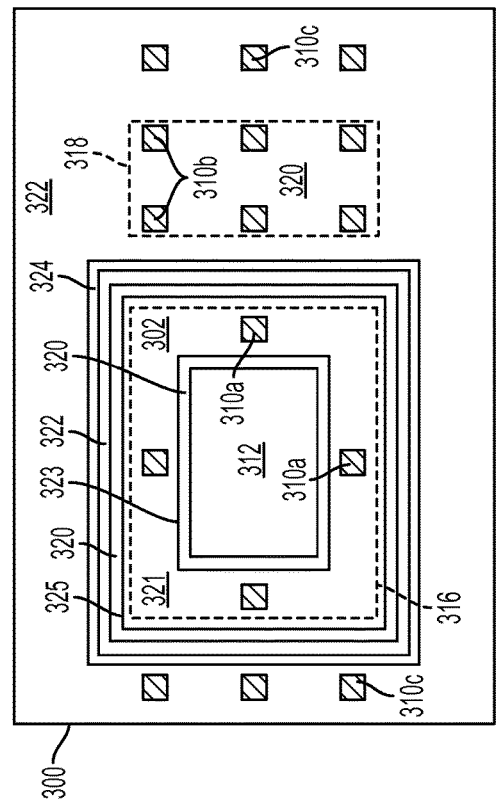
FIG. 8d
FIG. 8e

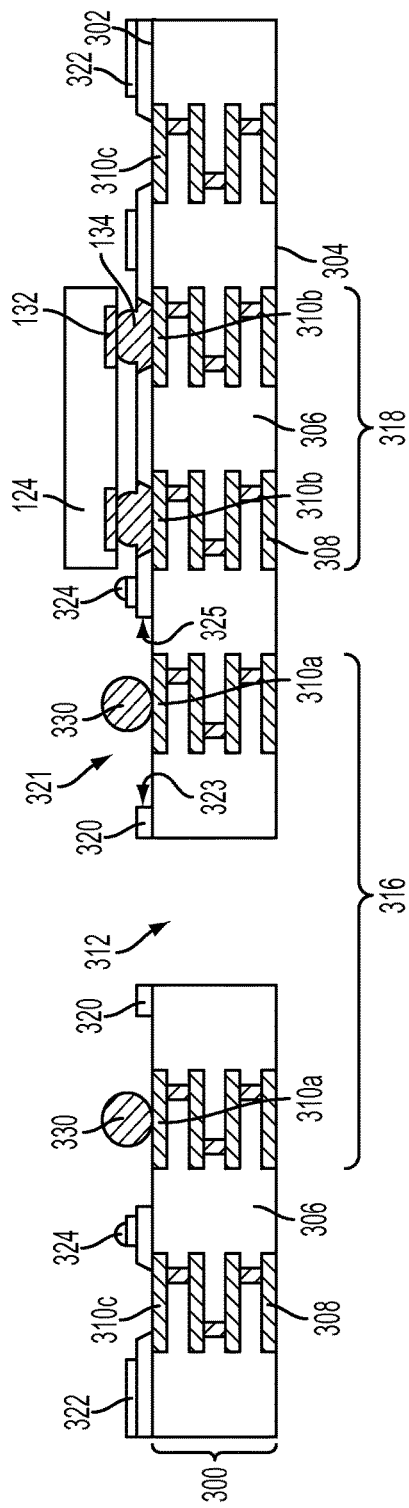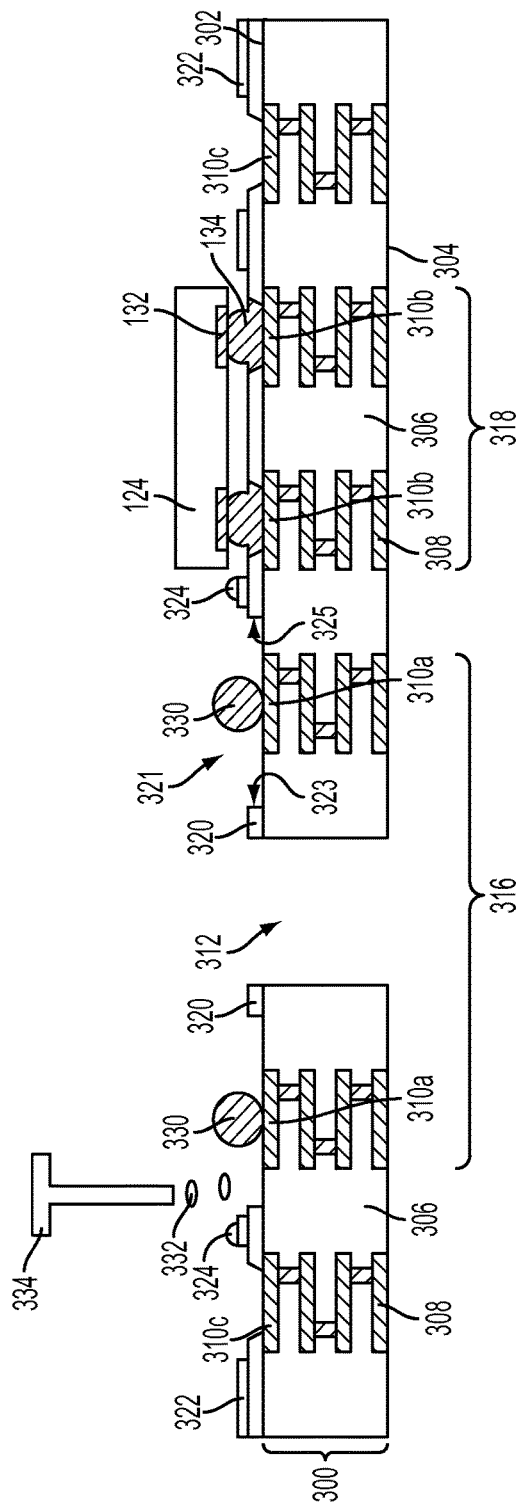

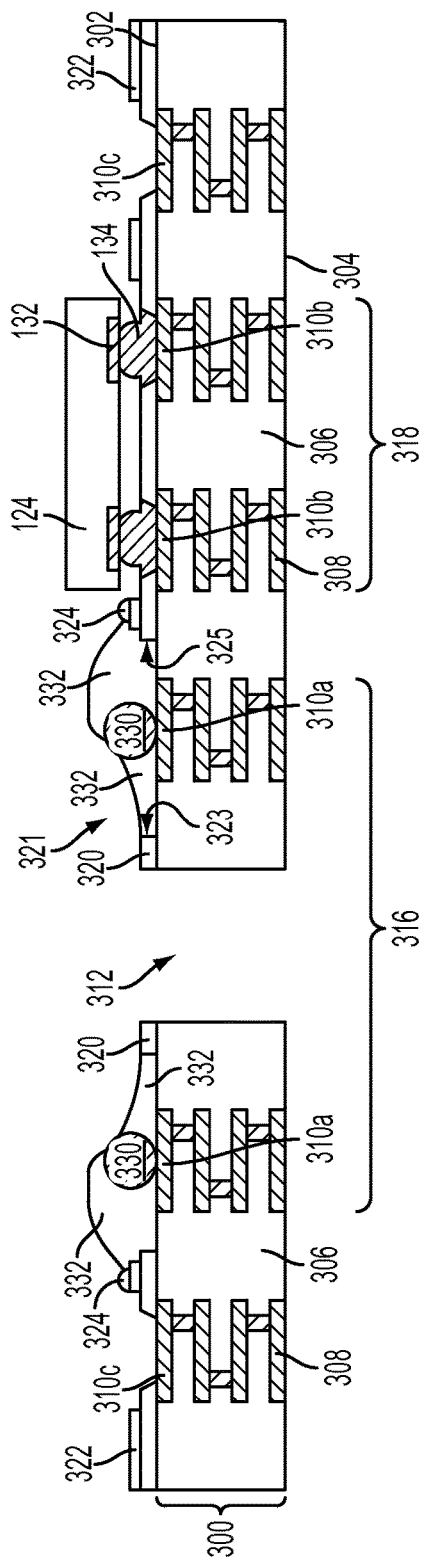
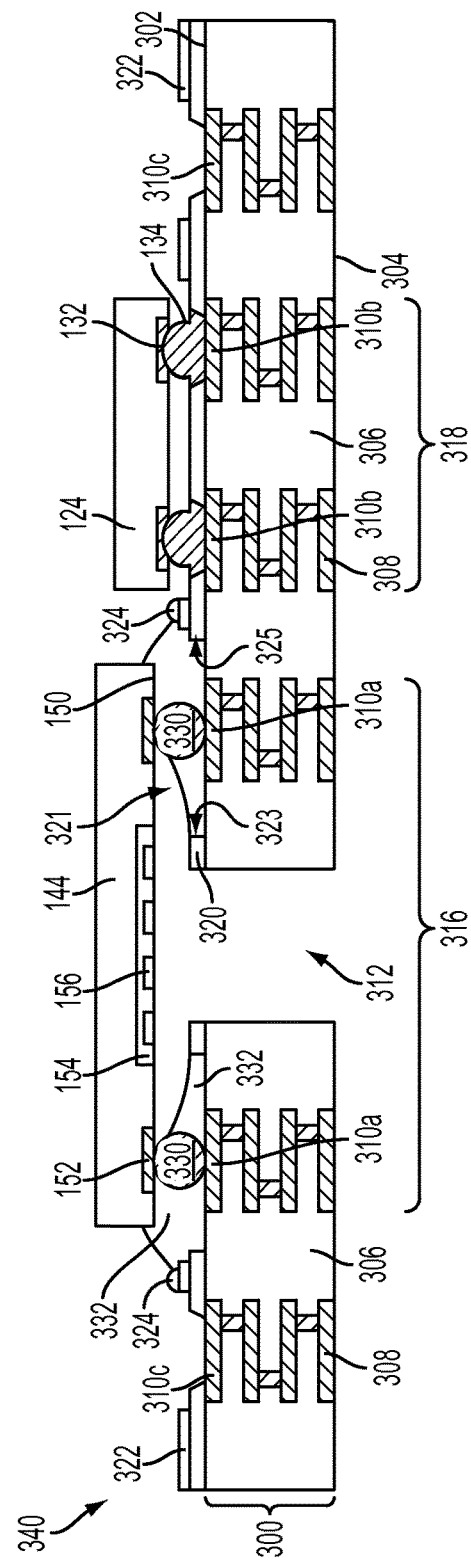

SEMICONDUCTOR DEVICE AND METHOD OF FORMING TRENCH AND DISPOSING SEMICONDUCTOR DIE OVER SUBSTRATE TO CONTROL OUTWARD FLOW OF UNDERFILL MATERIAL

FIELD OF THE INVENTION

The present invention relates in general to semiconductor devices and, more particularly, to a semiconductor device and method of forming a trench and disposing semiconductor die over a substrate to control the outward flow of underfill material.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die has an active surface containing analog or digital circuits implemented as active devices, passive devices, conductive layers, and dielectric layers formed within the die and electrically interconnected according to the electrical design and function of the die. The active surface performs the electrical and mechanical design function of the semiconductor die. The active surface may also contain a sensor such as a photodiode, phototransistor, Hall effect device, piezoelectric device, nanoelectronic device, and microelectromechanical device. The active surface responds to stimulus such as light, sound, heat, electromagnetic radiation, electric fields, magnetic fields, motion, ionizing radiation, vibration, motion, acceleration, rotation, pressure, and temperature to enable the semiconductor die to perform design functions. For example, an optical sensor on the active surface reacts to light which passes through an opening or window in the semiconductor package to reach the sensor.

A semiconductor die or package is commonly mounted to a substrate or printed circuit board (PCB). In the case of a flipchip type semiconductor die, bumps formed on the active surface of the semiconductor die are metallurgically and electrically connected to contact pads on the substrate. An underfill material or epoxy is dispensed in the void between the semiconductor die and the substrate for structural support and environmental isolation. Dispensing the proper amount of underfill material is difficult to control. Excess underfill material typically bleeds out or flows outward, beyond the footprint of the semiconductor die. The excess underfill material can cover items which were not intended to be covered, such as contact pads on the substrate or sensors on the active surface of the semiconductor die. In addition, dispensing the proper amount of underfill material, in the proper location, can be difficult due to the close proximity of adjacent semiconductor die on the substrate.

SUMMARY OF THE INVENTION

A need exists to dispose underfill material between a semiconductor die and a substrate in a simple, cost effective manner, while preventing the underfill material from contacting sensors on the semiconductor die and covering unintended areas on the surface of the substrate. Accordingly, in one embodiment, the present invention is a method of making a semiconductor device comprising the steps of providing a substrate including an opening, forming a trench over the substrate around the opening, forming an interconnect structure in the trench; disposing an underfill material over the interconnect structure, and disposing a first semiconductor die over the underfill material.

In another embodiment, the present invention is a method of making a semiconductor device comprising the steps of providing a substrate, forming an interconnect structure over the substrate, disposing an underfill material over the interconnect structure, and disposing a semiconductor die over the underfill material.

In another embodiment, the present invention is a semiconductor device comprising a substrate and a trench formed over the substrate. An underfill material is disposed in the trench. A semiconductor die is disposed over the underfill material prior to curing the underfill material.

In another embodiment, the present invention is a semiconductor device comprising a substrate and an interconnect structure formed over the substrate. An underfill material is disposed over the interconnect structure. A semiconductor die is disposed over the underfill material.

BRIEF DESCRIPTION OF THE DRAWINGS

FIGS. 4a-4b illustrate a semiconductor wafer with a plurality of semiconductor die including an active region separated by a saw street;

FIGS. 5a-5l illustrate forming an underfill-retaining trench bounded by dams over a substrate and disposing semiconductor die over the substrate;

FIGS. 6a-6i illustrate forming an underfill-retaining trench over a substrate and disposing semiconductor die over the substrate;

FIGS. 7a-7h illustrate forming an underfill-retaining trench surrounded by an insulating layer over a substrate and disposing semiconductor die over the substrate;

FIGS. 8a-8i illustrate forming an underfill-retaining trench surrounded by an insulating layer and a dam over a substrate and disposing semiconductor die over the substrate.

DETAILED DESCRIPTION OF THE DRAWINGS

Figure 1:
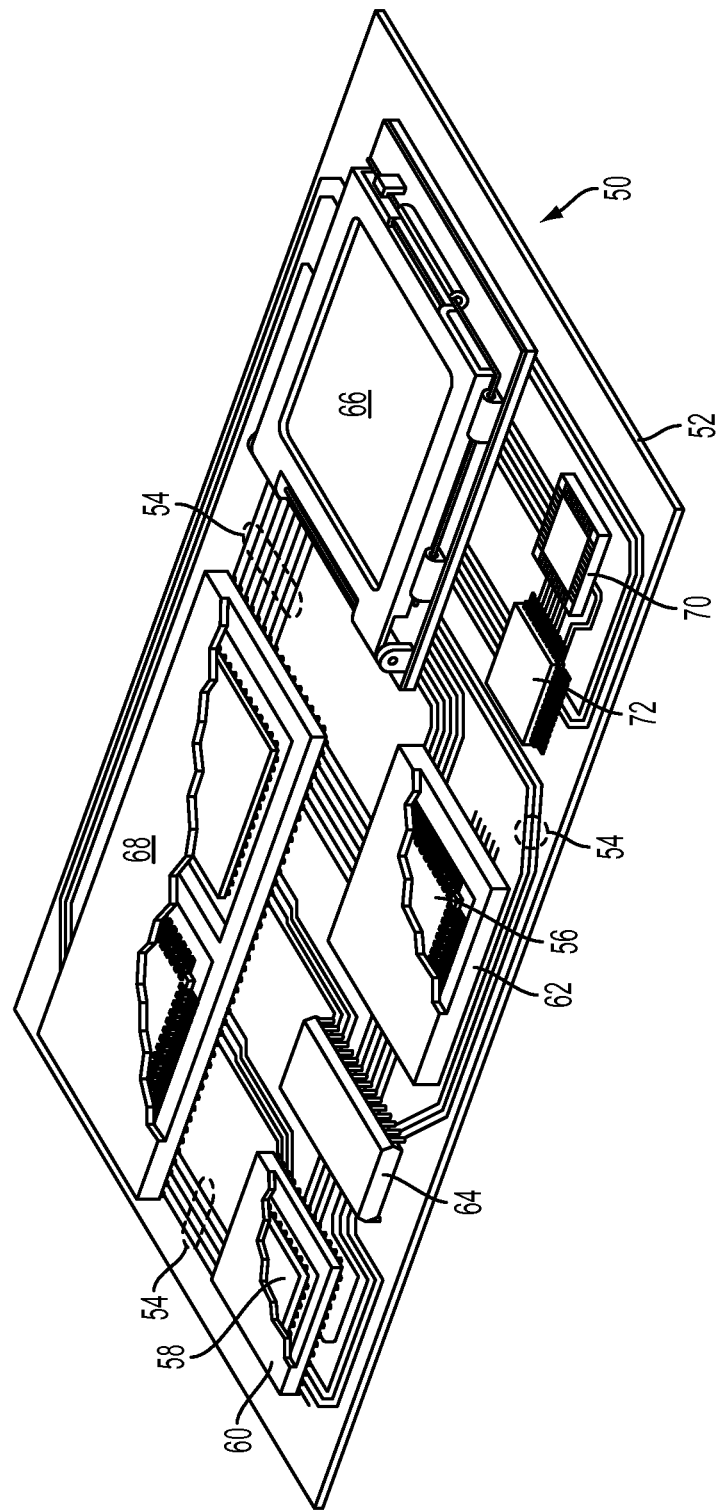
FIG. 1 illustrates a PCB with different types of packages mounted to a surface of the PCB.

The present invention is described in one or more embodiments in the following description with reference to the figures, in which like numerals represent the same or similar elements. While the invention is described in terms of the best mode for achieving the invention's objectives, a person of ordinary skill in the art will appreciate that the disclosure is intended to cover alternatives, modifications, and equivalents as may be included within the spirit and scope of the invention as defined by the appended claims and the equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of the semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on the surface of the PCB. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
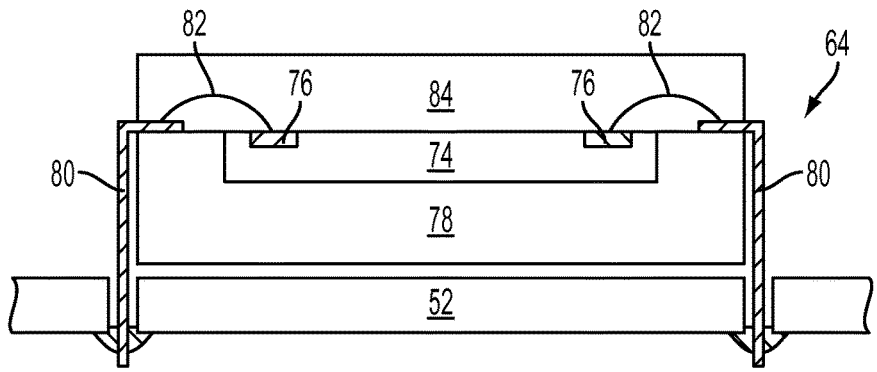
FIGS. 2a-2c illustrate further detail of the representative semiconductor packages mounted to the PCB.
Figure 2B:
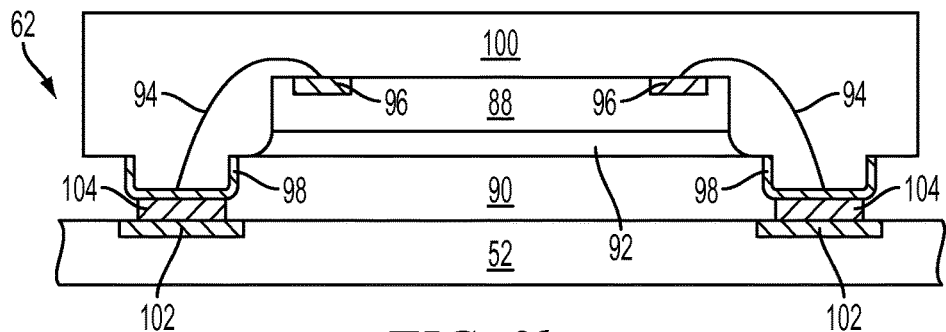
Figure 2C:
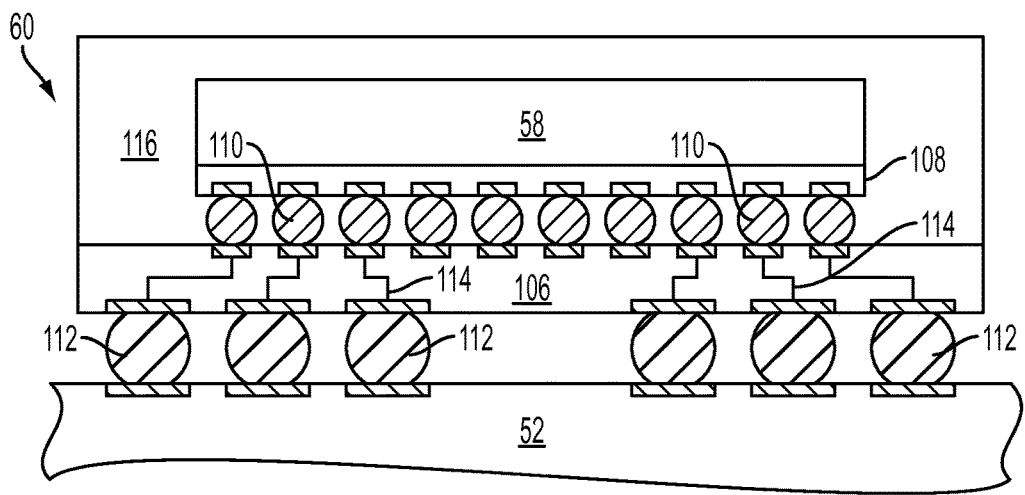

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
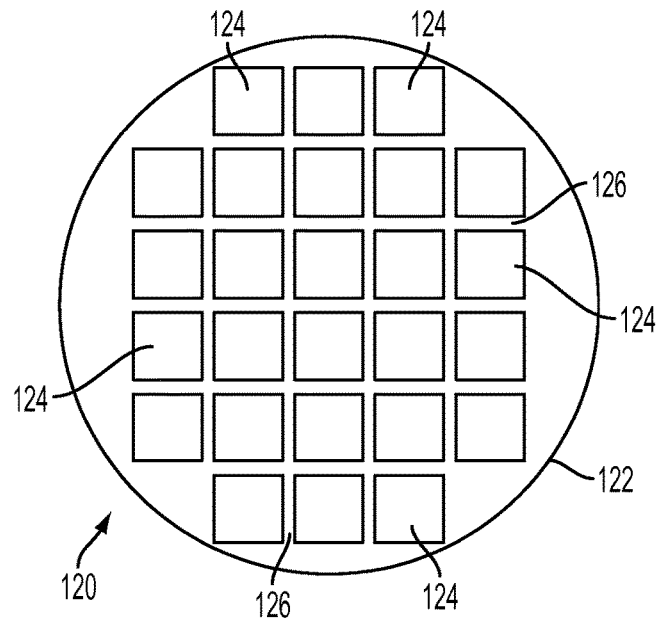
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126, as described above. Saw street 126 provides cutting areas to singulate semiconductor wafer 120 into individual semiconductor die 124.

Figure 3B:
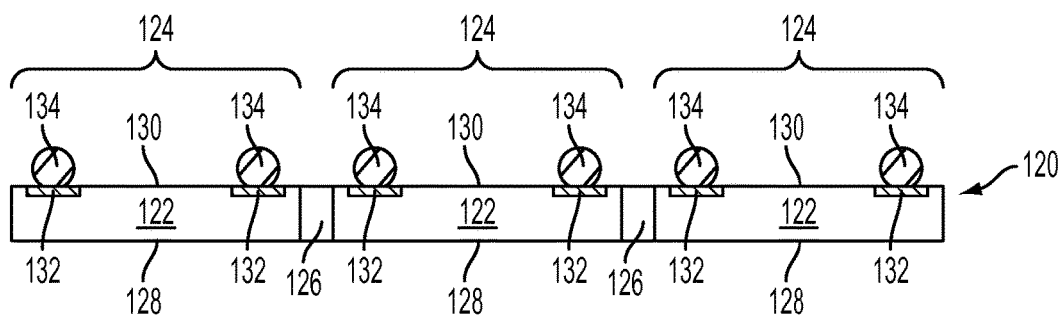

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as a digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, Ti, W, Pd, Pt, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over conductive layer 132 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above the material's melting point to form balls or bumps 134. In some applications, bumps 134 are reflowed a second time to improve electrical contact to conductive layer 132. Bumps 134 can also be compression bonded or thermocompression bonded to conductive layer 132. Bumps 134 represent one type of interconnect structure that can be formed over conductive layer 132. The interconnect structure can also use stud bump, micro bump, or other electrical interconnect.

Figure 3C:
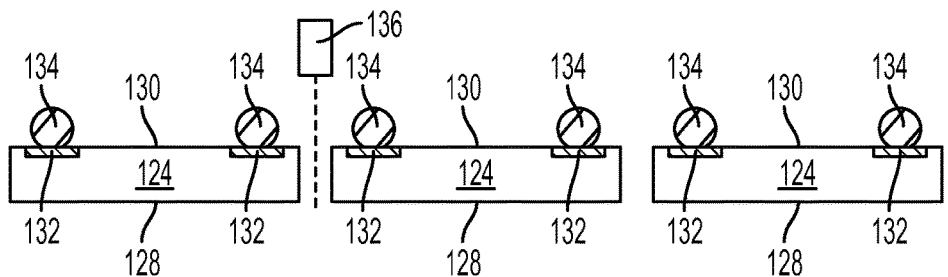

In FIG. 3c, semiconductor wafer 120 is singulated through saw street 126 using a saw blade or laser cutting tool 136 into individual flipchip type semiconductor die 124. Alternatively, singulation of semiconductor wafer 120 can be accomplished using a water jet to remove material within saw street 126.

FIG. 4a shows a semiconductor wafer 140 with a base substrate material 142, such as silicon, germanium, gallium arsenide, indium phosphide, or silicon carbide, for structural support. A plurality of semiconductor die or components 144 is formed on wafer 140 separated by a non-active, inter-die wafer area or saw street 146, as described above. Saw street 146 provides cutting areas to singulate semiconductor wafer 140 into individual semiconductor die 144.

Each semiconductor die 144 has an active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as DSP, ASIC, memory, or other signal processing circuit. Semiconductor die 144 may also contain IPDs, such as inductors, capacitors, and resistors, for RF signal processing An active region 154 is formed on active surface 150 of semiconductor die 144, typically during the front-end manufacturing process. In one embodiment, active region 154 contains analog and digital circuits. In another embodiment, active region 154 includes one or more active sensors, such as photodiode, phototransistor, and Hall effect device, having the ability to generate or control the flow of electrical current in response to an external stimulus. Alternatively, active region 154 includes one or more passive sensors, such as a photoresistor, thermistor, capacitive accelerometer, and load cell, having the ability to alter the relationship between voltage and current in response to the external stimulus. Active region 154 can also contain a piezoelectric device, nanoelectronic device, or microelectromechanical device. The external stimulus can be light, sound, electromagnetic radiation, electric field, magnetic field, ionizing radiation, vibration, motion, acceleration, rotation, orientation, pressure, and temperature. Active region 154 is electrically connected to other analog and digital circuits on active surface 150 to perform design functions of semiconductor die 144 in response to the external stimulus.

Active region 154 includes an array of sensors 156, for example, photodiodes or phototransistors. Active region 154 may also include active devices, passive devices, and interconnect structures electrically connected to sensors 156 and providing the ability to control the accumulation and transmission of electrical signals from sensors 156. Furthermore, active region 154 is electrically connected to analog and digital circuits within active surface 150, such as amplifiers, multiplexers, digital-to-analog converters (DAC), and analog-to-digital converters (ADC), providing the ability to electronically capture the signals from sensors 156. In another embodiment, active region 154 contains analog circuits, digital circuits, or devices responsive to an external stimulus.

An electrically conductive layer 152 is formed on active surface 150 using PVD, CVD, electrolytic plating, electroless plating process, or other suitable deposition process. Conductive layer 152 can be one or more layers of Al, Cu, Sn, Ni, Au, Ag, or other suitable electrically conductive material. Conductive layer 152 operates as contact pads electrically connected to active region 154, as well as the analog and digital circuits formed on active surface 150. Conductive layer 152 can be formed as contact pads disposed side-by-side a first distance from the edge of semiconductor die 144. Alternatively, conductive layer 152 can be formed as contact pads that are in multiple rows such that a first row of contact pads is disposed a first distance from the edge of the die, and a second row of contact pads alternating with the first row is disposed a second distance from the edge of the die.

In FIG. 4b, semiconductor wafer 140 is singulated through saw street 146 using a saw blade or laser cutting tool 158 into individual semiconductor die 144. Alternatively, semiconductor wafer 140 can be singulated using back grinding, stealth dicing, or scribing.

Figure 5C:
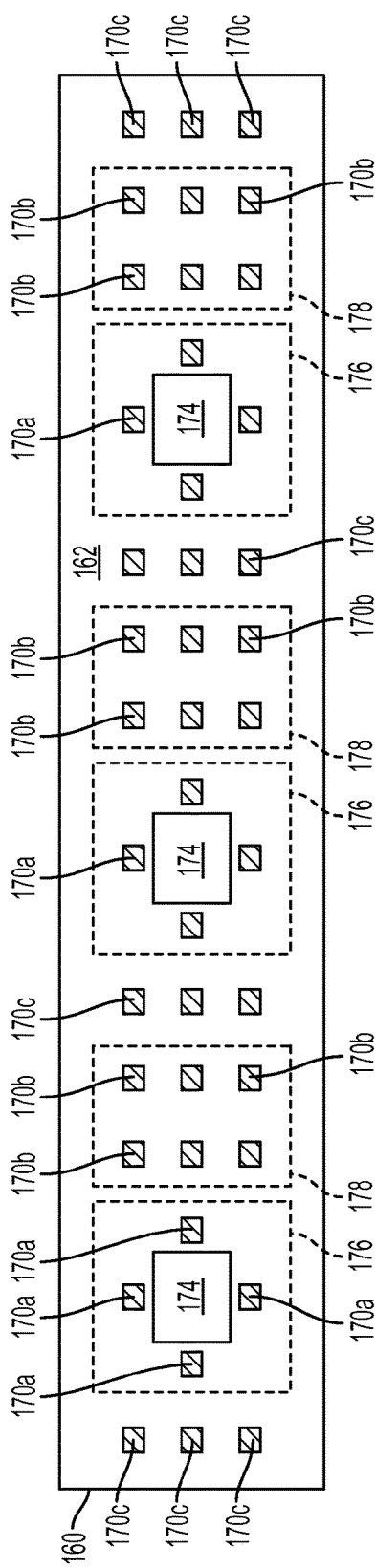

FIGS. 5a-5l illustrate, in relation to FIGS. 1 and 2a-2c, a process of forming an underfill-retaining trench, bounded by two dams, over a substrate to control the outward flow of excess underfill material and disposing a semiconductor die over the underfill material. FIG. 5a shows an interposer or substrate 160 including a surface 162 and an opposing surface 164. Substrate 160 includes one or more insulating layers 166 and one or more conductive layers 168. Conductive layers 168 provide vertical and horizontal conduction paths through substrate 160. Portions of conductive layers 168 are electrically common or electrically isolated according to the design and function of the semiconductor die to be mounted to substrate 160.

A plurality of contact pads 170 is formed in surface 162 of substrate 160. Contact pads 170 are one or more layers of conductive material, such as Al, Cu, Sn, Ni, Au, or Ag, and are electrically connected to conductive layers 168 within substrate 160. Substrate 160 provides structural support and electrical interconnect through conductive layers 168 and contact pads 170.

In FIG. 5b, one or more openings 174 are formed through substrate 160. Opening 174 extends completely through substrate 160 from surface 162 to surface 164. Opening 174 is devoid of any material and allows stimuli, e.g., light, to pass through substrate 160 and reach sensors on the active surface of the later mounted semiconductor die. Surface 162 of substrate 160 includes an area 176 around opening 174 and contact pads 170a designated for attaching a semiconductor die to contact pads 170a. Surface 162 also includes an area 178 outside the footprint of die attach area 176 designated for attaching a semiconductor die to contact pads 170b.

FIG. 5c shows a plan view of substrate 160. Contact pads 170a are disposed around opening 174 within area 176. Contact pads 170b are disposed outside area 176, within area 178. Contact pads 170c are disposed outside of both area 176 and area 178.

Figure 5D:
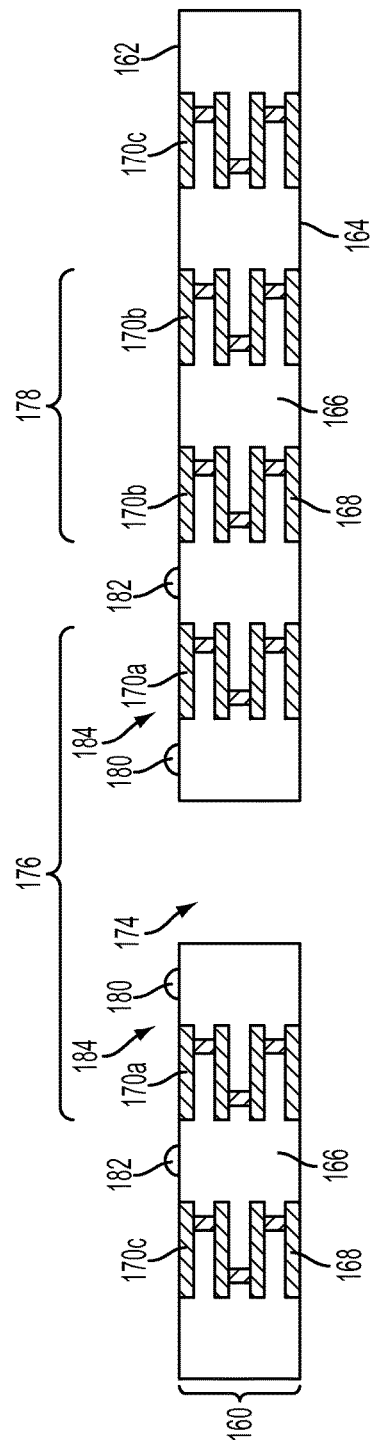

In FIG. 5d, a dam 180 is formed over surface 162 of substrate 160 around opening 174. Dam 180 is disposed between opening 174 and contact pads 170a. Dam 180 is a solder resist, adhesive, insulation, polymer, metal, or other suitable barrier material. Dam 180 is formed by screen printing, electrolytic plating, electroless plating, spray coating, or other suitable deposition process.

A dam 182 is formed over surface 162 of substrate 160 around contact pads 170a outside die attach area 176. Dam 182 is a solder resist, adhesive, insulation, polymer, metal, or other suitable barrier material. Dam 182 is formed by screen printing, electrolytic plating, electroless plating, spray coating, or other suitable deposition process.

Figure 5E:
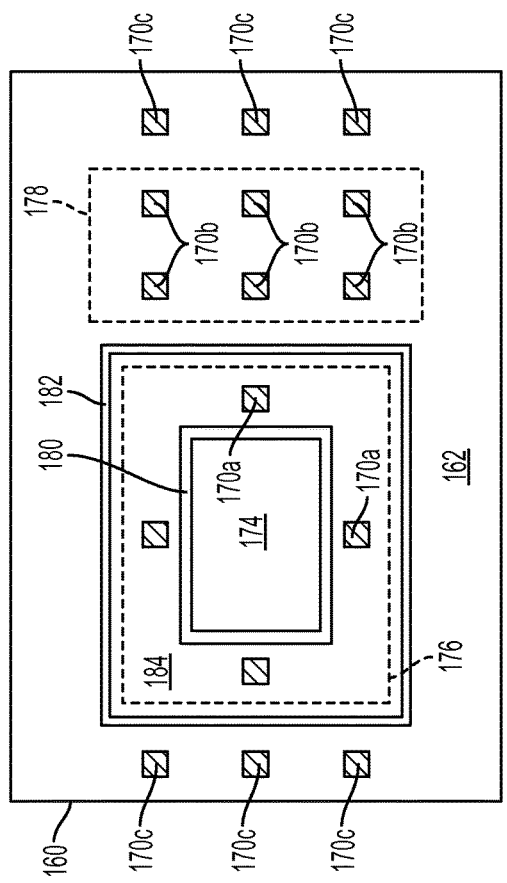

Dam 180 and dam 182 form an underfill-retaining trench 184 over substrate 160 around opening 174. FIG. 5e shows a plan view of dam 180, dam 182, and trench 184 formed over surface 162 of substrate 160. Dam 180 is the inner boundary of trench 184 and dam 182 is the outer boundary of trench 184. Dam 180 forms a barrier between contact pads 170a and opening 174. Dam 182 forms a barrier between die attach area 176 and die attach area 178 and between contact pads 170*a* and 170*c*.

Figure 5F:
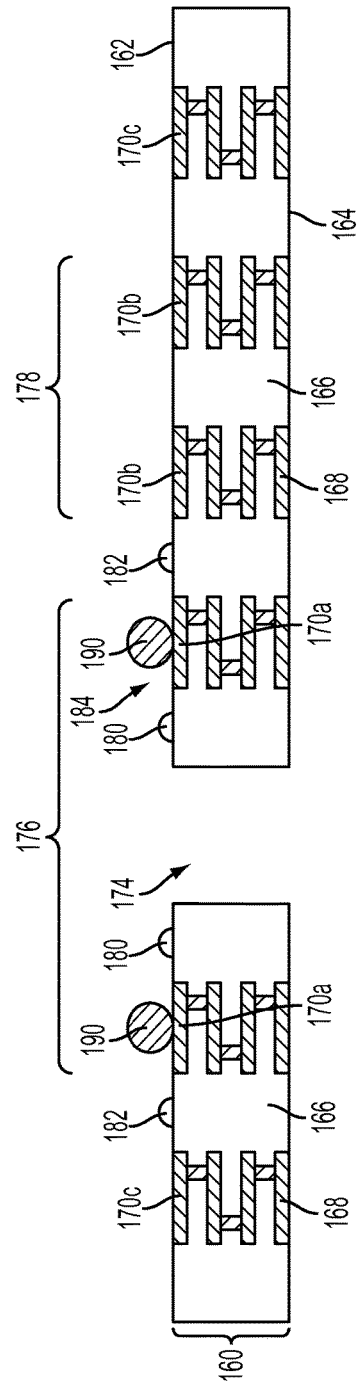

In FIG. 5*f*, an electrically conductive bump material is deposited over contact pads 170*a* using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 170*a* using a suitable attachment or bonding process. In one embodiment, the bump material is reflowed by heating the material above the material's melting point to form balls or bumps 190. In some applications, bumps 190 are reflowed a second time to improve electrical connection to contact pads 170*a*. In one embodiment, bumps 190 are formed over an under bump metallization (UBM) having a wetting layer, barrier layer, and adhesive layer. Bumps 190 can also be compression bonded or thermocompression bonded to contact pads 170*a*. Bumps 190 represent one type of interconnect structure that can be formed over contact pads 170*a*. The interconnect structure can also use stud bump, micro bump, or other electrical interconnect. FIG. 5*g* shows a plan view of bumps 190 disposed over substrate 160 between dam 180 and dam 182 in trench 184.

In FIG. 5*h*, a semiconductor die 124 from FIGS. 3*a*-3*c* is disposed over surface 162 of substrate 160 within die attach area 178. Semiconductor die 124 is mounted to substrate 160 by reflowing bumps 134 to metallurgically and electrically connect bumps 134 to contact pads 170*b*. Semiconductor die 124 is a known good die (KGD) having been tested prior to mounting semiconductor die 124 to substrate 160. In one embodiment, semiconductor die 124 is an ASIC. Substrate 160 has sufficient size to accommodate multiple semiconductor die 124. FIG. 5*i* shows a plan view of semiconductor die 124 disposed over substrate 160 within die attach area 178. Contact pads 170*c* are outside the footprint of semiconductor die 124. Dam 182 is disposed between die attach area 176 and semiconductor die 124.

FIG. 5*j* shows a dispenser 196 depositing an underfill material 194. Underfill material 194 is deposited over bumps 190 using a paste printing, compressive molding, transfer molding, liquid encapsulant molding, vacuum lamination, spin coating, mold underfill, or other suitable application process. Underfill material 194 can be polymer composite material, such as epoxy resin with filler, epoxy acrylate with filler, or polymer with proper filler. Dispenser 196 has unfettered access to bumps 190, because no semiconductor die is present in area 176 when dispenser 196 deposits underfill material 194. The absence of a semiconductor die in area 176 allows underfill material 194 to be easily dispensed over bumps 190.

FIG. 5*k* shows uncured underfill material 194 disposed over bumps 190. Dam 180 and dam 182 contain any excess underfill material 194 flowing away from bump 190 and keep underfill material 194 within trench 184. Dam 182 blocks underfill material 194 from flowing over semiconductor die 124. Dam 182 also blocks underfill material 194 from covering contact pads 170*c*. Contact pads 170*c* remain devoid of underfill material 194 and are able to make unobstructed electrical connection between substrate 160 and external components. In one embodiment, contact pads 170*c* are ground pads. Dam 180 blocks underfill material 194 from flowing into opening 174. Dam 180 keeps opening 174 completely devoid of any underfill material 194.

In FIG. 5*l*, a semiconductor die 144 from FIGS. 4*a*-4*b* is disposed over surface 162 of substrate 160 within area 176. Active region 154 is disposed over opening 174. Bumps 190 are reflowed and semiconductor die 144 is pressed toward substrate 160. Bumps 190 metallurgically and electrically connect conductive layer 152 of semiconductor die 144 to contact pads 170*a*. In some applications, bumps 190 are reflowed a second time to improve electrical contact to conductive layer 152. The uncured underfill material 194 flows over the sides of semiconductor die 144. Underfill material 194 covers the outer parts of active surface 150 of semiconductor die 144, but not active region 154. Pressing semiconductor die 144 toward substrate 160 and into underfill material 194 may cause underfill material 194 to flow away from bumps 190. The outward flow of any underfill material 194 caused by mounting semiconductor die 144 is contained by dam 180 and dam 182 within trench 184. The width of trench 184, i.e., the location of dam 180, is selected to prevent underfill material 194 from flowing over the active region 154 of semiconductor die 144. Dam 180 prevents underfill material 194 from blocking or contacting sensors 156 in active region 154. Dam 180 also keeps underfill material 194 from flowing into opening 174. Unblocked sensors 156 are able to react to external stimulus passing through opening 174. Dam 182 blocks underfill material 194 from flowing over semiconductor die 124 or covering contact pads 170*c*.

Underfill material 194 is cured after semiconductor die 144 is attached to substrate 160. Cured underfill 194 extends from the sides of semiconductor die 144, over bumps 190, to surface 162 of substrate 160. Cured underfill 194 provides structural support and environmental isolation for semiconductor die 144.

Substrate 160, dam 180, dam 182, semiconductor die 144, semiconductor die 124, and cured underfill 194 form semiconductor die package 198. The location of underfill material 194 over substrate 160 in package 198 is easily and accurately controlled. The underfill dispenser has easy and complete access to die attach area 176, because semiconductor die 144 is mounted to substrate 160 after underfill material 194 is deposited. Underfill material 194 covers the outer parts of active surface 150 of semiconductor die 144, but not active region 154. Dam 180 and dam 182 provide an underfill-retaining trench 184 over substrate 160 and block the outward flow of underfill material 194. Dam 182 prevents underfill material 194 from contacting semiconductor die 124 or covering contact pads 170*c*. Uncovered contact pads 170*c* are able to make unobstructed electrical connection between substrate 160 and external components. Dam 180 prevents underfill material 194 from flowing into opening 174 or blocking sensors 156. Opening 174 remains devoid of all material and unblocked sensors 156 are able receive external stimuli through opening 174. Underfill 194 extends over the sides of semiconductor die 144 and fills the space between semiconductor die 144 and surface 162 of substrate. After curing, underfill 194 provides structural support and environmental isolation for semiconductor die 144.

Figure 6C:
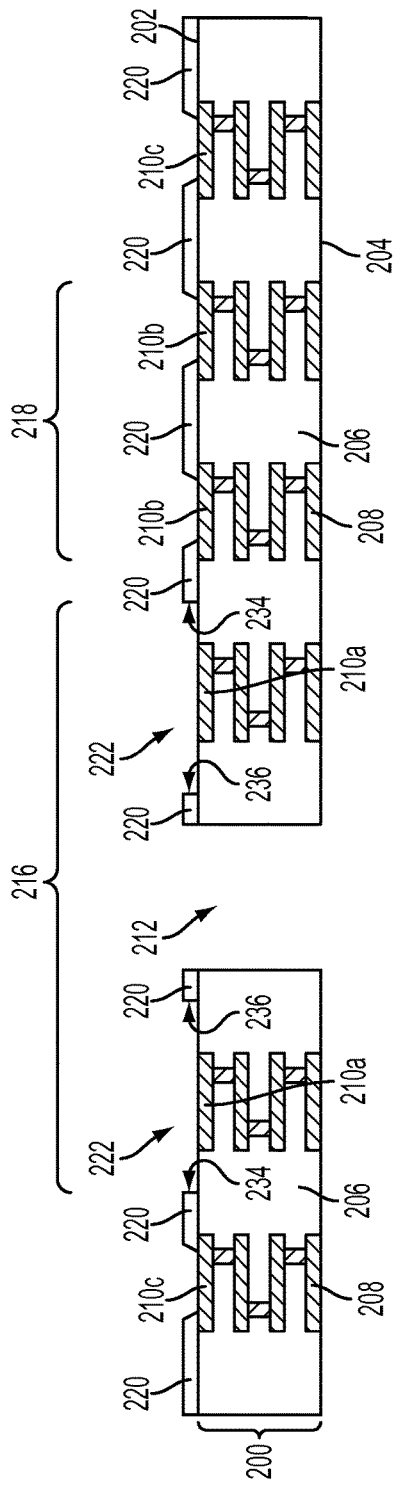

FIGS. 6*a*-6*i* illustrate, in relation to FIGS. 1 and 2*a*-2*c*, a process of forming an underfill-retaining trench over a substrate to control the outward flow of excess underfill material and disposing a semiconductor die over the underfill material. FIG. 6*a* shows an interposer or substrate 200 including a surface 202 and an opposing surface 204. Substrate 200 includes one or more insulating layers 206 and one or more conductive layers 208. Conductive layers 208 provide vertical and horizontal conduction paths through substrate 200. Portions of conductive layers 208 are electrically common or electrically isolated according to the design and function of the semiconductor die to be mounted to substrate 200.

A plurality of contact pads 210 is formed in surface 202 of substrate 200. Contact pads 210 are one or more layers of conductive material, such as Al, Cu, Sn, Ni, Au, or Ag, and are electrically connected to conductive layers 208 within substrate 200. Substrate 200 provides structural support and electrical interconnect through conductive layers 208 and contact pads 210.

One or more openings 212 are formed through substrate 200. Opening 212 extends completely through substrate 200 from surface 202 to surface 204. Opening 212 is devoid of any material and allows stimuli, e.g., light, to pass through substrate 200 and reach sensors on the active surface of the later mounted semiconductor die. Surface 202 of substrate 200 includes an area 216 around opening 212 and contact pads 210a designated for attaching a semiconductor die to contact pads 210a. Surface 202 also includes an area 218 outside the footprint of die attach area 216 designated for attaching a semiconductor die to contact pads 210b.

FIG. 6b shows a plan view of substrate 200. Contact pads 210a are disposed around opening 212 within area 216. Contact pads 210b are disposed outside area 216, within area 218. Contact pads 210c are disposed outside of both area 216 and area 218.

In FIG. 6c, an insulating or passivation layer 220 is formed over surface 202 of substrate 200. Insulating layer 220 is formed using PVD, CVD, printing, spin coating, spray coating, sintering or thermal oxidation. Insulating layer 220 contains one or more layers of solder resist, SiO2, Si3N4, SiON, Ta2O5, Al2O3, HfO2, BCB, PI, PBO, polymer, or other material having similar structural and insulating properties. A portion of insulating layer 220 is removed by laser direct ablation (LDA) using an infrared (IR) or ultraviolet (UV) laser to define an underfill-retaining trench 222 and expose contact pads 210a, contact pads 210b, and contact pads 210c. Insulating layer 220 forms outer sidewall 234 and inner sidewall 236 of trench 222. Alternatively, a portion of insulating layer 220 is removed by an etching process through a patterned photoresist layer to define trench 222 and expose contact pads 210a, contact pads 210b, and contact pads 210c.

Figure 6D:
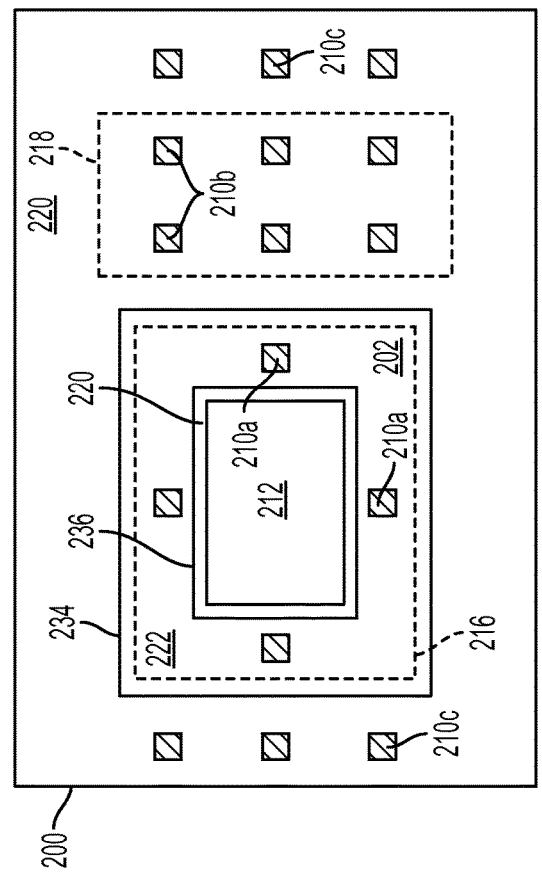

FIG. 6d shows a plan view of insulating layer 220 and underfill-retaining trench 222 formed over surface 202 of substrate 200. Trench 222 is disposed around opening 212. Insulating layer 220 forms outer sidewall 234 and inner sidewall 236 of trench 222. Sidewall 236 of trench 222 forms a barrier between contact pads 210a and opening 212. Sidewall 234 of trench 222 forms a barrier between die attach area 216 and die attach area 218 and between contact pads 210a and 210c. Contact pads 210a are exposed in the floor of trench 222. Openings in insulating layer 220 also expose contact pads 210b and contact pads 210c.

In FIG. 6e, an electrically conductive bump material is deposited over contact pads 210a using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 210a using a suitable attachment or bonding process. In one embodiment, the bump material is reflowed by heating the material above the material's melting point to form balls or bumps 224. In some applications, bumps 224 are reflowed a second time to improve electrical connection to contact pads 210a. In one embodiment, bumps 224 are formed over a UBM having a wetting layer, barrier layer, and adhesive layer. Bumps 224 can also be compression bonded or thermocompression bonded to contact pads 210a. Bumps 224 represent one type of interconnect structure that can be formed over contact pads 210a. The interconnect structure can also use stud bump, micro bump, or other electrical interconnect.

FIG. 6f shows semiconductor die 124 from FIGS. 3a-3c disposed over insulating layer 220 and surface 202 of substrate 200. Semiconductor die 124 is disposed within die attach area 218. Semiconductor die 124 is mounted to substrate 200 by reflowing bumps 134 to metallurgically and electrically connect bumps 134 to contact pads 210b. Semiconductor die 124 is a KGD having been tested prior to mounting semiconductor die 124 to substrate 200. In one embodiment, semiconductor die 124 is an ASIC. Substrate 200 has sufficient size to accommodate multiple semiconductor die 124. Contact pads 210c are outside the footprint of semiconductor die 124.

FIG. 6g shows a dispenser 232 depositing an underfill material 230. Underfill material 230 is deposited over bumps 224 in trench 222 using a paste printing, compressive molding, transfer molding, liquid encapsulant molding, vacuum lamination, spin coating, mold underfill, or other suitable application process. Underfill material 230 can be polymer composite material, such as epoxy resin with filler, epoxy acrylate with filler, or polymer with proper filler. Dispenser 232 has unfettered access to bumps 224, because no semiconductor die is present in area 216 when dispenser 232 deposits underfill material 230. The absence of a semiconductor die in area 216 allows underfill material 230 to be easily dispensed over bumps 224.

FIG. 6h shows uncured underfill material 230 disposed over bumps 224. Trench 222 contains any excess underfill material 230 flowing away from bumps 224. Outer sidewall 234 of trench 222 blocks underfill material 230 from flowing over semiconductor die 124. Sidewall 234 also blocks underfill material 230 from covering contact pads 210c. Contact pads 210c remain devoid of underfill material 230 and are able to make unobstructed electrical connection between substrate 200 and external components. In one embodiment, contact pads 210c are ground pads. Inner sidewall 236 of trench 222 prevents any excess underfill material 230 from flowing into opening 212. Inner sidewall 236 keeps opening 212 completely devoid of underfill material 230.

Figure 6I:
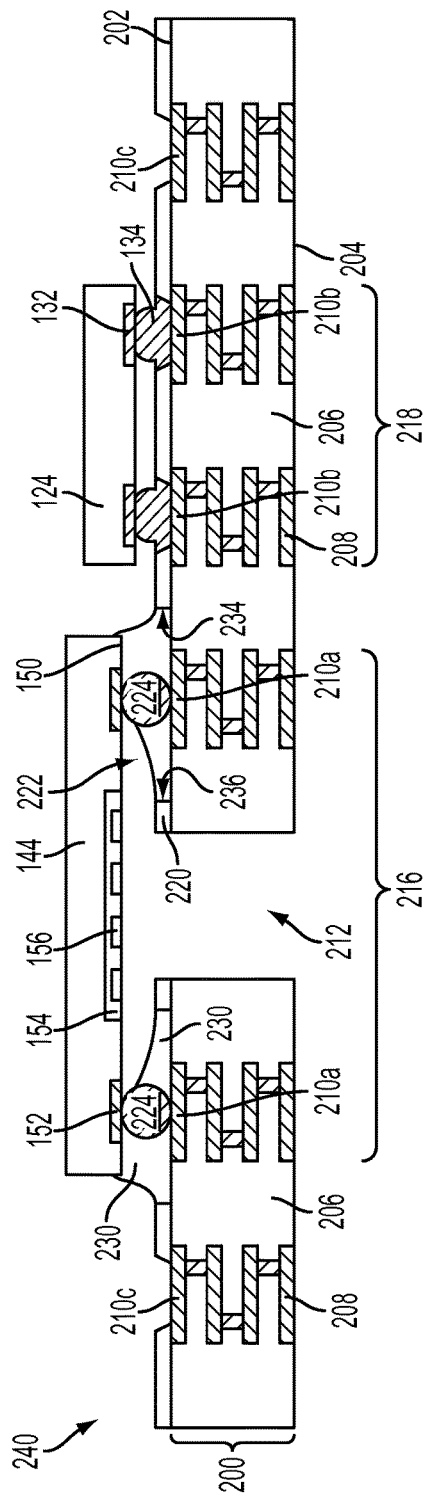

In FIG. 6i, a semiconductor die 144 from FIGS. 4a-4b is disposed over surface 202 of substrate 200 within area 216. Active region 154 is disposed over opening 212. Bumps 224 are reflowed and semiconductor die 144 is pressed toward substrate 200. Bumps 224 metallurgically and electrically connect conductive layer 152 of semiconductor die 144 to contact pads 210a. In some applications, bumps 224 are reflowed a second time to improve electrical contact to conductive layer 152. Uncured underfill material 230 flows over the sides of semiconductor die 144. Underfill material 230 covers the outer parts of active surface 150 of semiconductor die 144, but not active region 154. Pressing semiconductor die 144 toward substrate 200 and into underfill material 230 may cause underfill material 230 to flow away from bumps 224. The outward flow of any underfill material 230 caused by mounting semiconductor die 144 is contained within trench 222 by sidewalls 234 and 236 of trench 222. The width of trench 222, i.e., the width of insulating layer 220 adjacent to opening 212, is selected to prevent underfill material 230 from flowing over the active region 154 of semiconductor die 144. Sidewall 236 of trench 222 blocks the flow of underfill material 230 and keeps underfill material 230 from blocking or contacting sensors 156 in active region 154. Sidewall 236 also blocks underfill material 230 from flowing into opening 212. Unblocked sensors 156 are able to react to external stimulus passing through opening 212. Sidewall 234 of trench 222 blocks underfill material 230 from flowing over semiconductor die 124 or covering contact pads 210c.

Underfill material 230 is cured after semiconductor die 144 is attached to substrate 200. Cured underfill 230 extends from the sides of semiconductor die 144, over bumps 224, to surface 202 of substrate 200. Cured underfill 230 provides structural support and environmental isolation for semiconductor die 144.

Substrate 200, insulating layer 220, semiconductor die 144, semiconductor die 124, and cured underfill 230 form semiconductor die package 240. The location of underfill material 230 over substrate 200 in package 240 is easily and accurately controlled. The underfill dispenser has easy and complete access to die attach area 216, because semiconductor die 144 is mounted to substrate 200 after underfill material 230 is deposited. Underfill 230 covers the outer parts of active surface 150 of semiconductor die 144, but not active region 154. Insulating layer 220 provides an underfill-retaining trench 222 around opening 212. Trench 222 contains the outward flow of underfill material 230. Sidewall 234 of trench 222 prevents underfill material 230 from contacting semiconductor die 124 or covering contact pads 210c. Uncovered contact pads 210c are able to make unobstructed electrical connection between substrate 200 and external components. Sidewall 236 of trench 222 prevents underfill material 230 from flowing into opening 212 or blocking sensors 156. Opening 212 remains devoid of all material and unblocked sensors 156 are able receive external stimuli through opening 212. Underfill material 230 extends over the sides of semiconductor die 144 and fills the space between semiconductor die 144 and surface 202 of substrate 200. After curing, underfill 230 provides structural support and environmental isolation for semiconductor die 144.

Figure 7A:
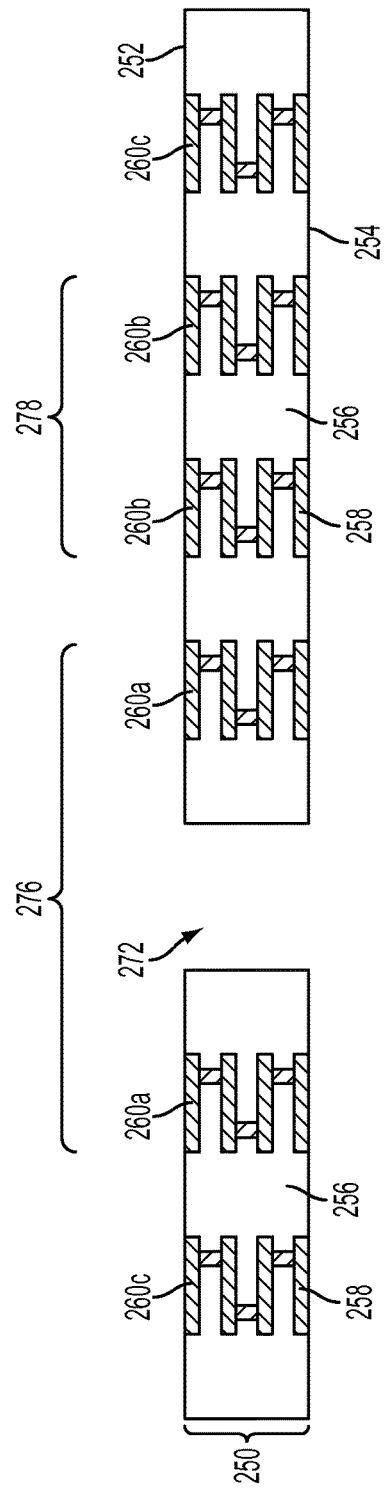

FIGS. 7a-7h illustrate, in relation to FIGS. 1 and 2a-2c, a process of forming an underfill-retaining trench surrounded by an insulating layer to control the outward flow of excess underfill material, and disposing a semiconductor die over the underfill material. FIG. 7a shows an interposer or substrate 250 including a surface 252 and an opposing surface 254. Substrate 250 includes one or more insulating layers 256 and one or more conductive layers 258. Conductive layers 258 provide vertical and horizontal conduction paths through substrate 250. Portions of conductive layers 258 are electrically common or electrically isolated according to the design and function of the semiconductor die to be mounted to substrate 250.

A plurality of contact pads 260 is formed in surface 252 of substrate 250. Contact pads 260 are one or more layers of conductive material, such as Al, Cu, Sn, Ni, Au, or Ag, and are electrically connected to conductive layers 258 within substrate 250. Substrate 250 provides structural support and electrical interconnect through conductive layers 258 and contact pads 260.

One or more openings 272 are formed through substrate 250. Opening 272 extends completely through substrate 250 from surface 252 to surface 254. Opening 272 is devoid of all material and allows stimuli, e.g., light, to pass through substrate 250 and reach sensors on the active surface of a later mounted semiconductor die. Surface 252 of substrate 250 includes an area 276 around opening 272 and contact pads 260a designated for attaching a semiconductor die to contact pads 260a. Surface 252 also includes an area 278 outside the footprint of die attach area 276 designated for attaching a semiconductor die to contact pads 260b. Contact pads 260a are disposed around opening 272 within area 276. Contact pads 260b are disposed outside area 276, within area 278. Contact pads 260c are disposed outside of both area 276 and area 278.

In FIG. 7b, an insulating or passivation layer 280 is formed over surface 252 of substrate 250. Insulating layer 280 is formed using PVD, CVD, printing, spin coating, spray coating, sintering or thermal oxidation. Insulating layer 280 contains one or more layers of solder resist, SiO2, Si3N4, SiON, Ta2O5, Al2O3, HfO2, BCB, PI, PBO, polymer, or other material having similar structural and insulating properties.

A portion of insulating layer 280 is removed by LDA using an IR or UV laser to define an underfill-retaining trench 282 and expose contact pads 260a, contact pads 260b, and contact pads 260c. Trench 282 is formed around opening 272. Insulating layer 280 forms outer sidewall 281 and inner sidewall 283 of trench 282. Sidewall 281 of trench 282 forms a barrier between die attach area 276 and die attach area 278 and between contact pads 260a and 260c. Sidewall 283 of trench 282 forms a barrier between contact pads 260a and opening 272. Contact pads 260a are exposed in the floor of trench 282. Openings in insulating layer 280 also expose contact pads 260b and contact pads 260c. Alternatively, a portion of insulating layer 280 is removed by an etching process through a patterned photoresist layer to define trench 282 and expose contact pads 260a, contact pads 260b, and contact pads 260c.

In FIG. 7c, an insulating or passivation layer 284 is formed over insulating layer 280. Insulating layer 284 is formed using PVD, CVD, printing, spin coating, spray coating, sintering or thermal oxidation. Insulating layer 284 contains one or more layers of solder resist, SiO2, Si3N4, SiON, Ta2O5, Al2O3, HfO2, BCB, PI, PBO, polymer, or other material having similar structural and insulating properties. A portion of insulating layer 284 is removed by LDA using an IR or UV laser to form sidewall 285 and expose insulating layer 280, trench 282, contact pads 260b, and contact pads 260c. A sidewall 285 of insulating layer 284 forms a barrier around the outer boundary, i.e., sidewall 281, of trench 282. Alternatively, a portion of insulating layer 284 is removed by an etching process through a patterned photoresist layer to form sidewall 285 and expose insulating layer 280, trench 282, contact pads 260b, and contact pads 260c.

FIG. 7d shows a plan view of insulating layer 284 disposed over substrate 250. Sidewall 285 of insulating layer 284 forms an additional barrier between die attach area 276 and contact pads 260c and between die attach area 276 and die attach area 278. Openings in insulating layer 284 also expose contact pads 260b and insulating layer 280 in die attach area 278, and contact pads 260c. In one embodiment, sidewall 285 and trench 282 are formed at the same time by removing portions of insulating layer 280 and insulating layer 284 in a single step.

In FIG. 7e, an electrically conductive bump material is deposited over contact pads 260a using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 260a using a suitable attachment or bonding process. In one embodiment, the bump material is reflowed by heating the material above the material's melting point to form balls or bumps 290. In some applications, bumps 290 are reflowed a second time to improve electrical connection to contact pads 260a. In one embodiment, bumps 290 are formed over a UBM having a wetting layer, barrier layer, and adhesive layer. Bumps 290 can also be compression bonded or thermocompression bonded to contact pads 260a. Bumps 290 represent one type of interconnect structure that can be formed over contact pads 260a. The interconnect structure can also use stud bump, micro bump, or other electrical interconnect.

Semiconductor die 124 from FIGS. 3a-3c is disposed over substrate 250 within die attach area 278. Semiconductor die 124 is mounted to substrate 250 by reflowing bumps 134 to metallurgically and electrically connect bumps 134 to contact pads 260b. Semiconductor die 124 is a KGD having been tested prior to mounting semiconductor die 124 to substrate 250. In one embodiment, semiconductor die 124 is an ASIC. Substrate 250 has sufficient size to accommodate multiple semiconductor die 124. Contact pads 260c are disposed outside the footprint of semiconductor die 124.

FIG. 7f shows a dispenser 296 depositing an underfill material 294. Underfill material 294 is deposited over bumps 290 in trench 282 using a paste printing, compressive molding, transfer molding, liquid encapsulant molding, vacuum lamination, spin coating, mold underfill, or other suitable application process. Underfill material 294 can be polymer composite material, such as epoxy resin with filler, epoxy acrylate with filler, or polymer with proper filler. Dispenser 296 has unfettered access to bumps 290, because no semiconductor die is present in area 276 when dispenser 296 deposits underfill material 294. The absence of a semiconductor die in area 276 allows underfill material 294 to be easily dispensed over bumps 290.

FIG. 7g shows uncured underfill material 294 disposed over bumps 290. Trench 282 and insulating layer 284 contain any excess underfill material 294 flowing away from bump 290. Inner sidewall 283 of trench 282 blocks any excess underfill material 294 from flowing into opening 272. Inner sidewall 283 keeps opening 272 completely devoid of any underfill material 294. Outer sidewall 281 of trench 282 and sidewall 285 of insulating layer 284 block underfill material 294 from flowing over semiconductor die 124. Sidewalls 281 and 285 also block underfill material 294 from covering contact pads 260c. Contact pads 210c remain devoid of underfill material 294 and are able to make unobstructed electrical connection between substrate 250 and external components. In one embodiment, contact pads 260c are ground pads.

In FIG. 7h, a semiconductor die 144 from FIGS. 4a-4b is disposed over surface 252 of substrate 250 within area 276. Active region 154 is disposed over opening 272. Bumps 290 are reflowed and semiconductor die 144 is pressed toward substrate 250. Bumps 290 metallurgically and electrically connect conductive layer 152 of semiconductor die 144 to contact pads 260a. In some applications, bumps 290 are reflowed a second time to improve electrical contact to conductive layer 152. The uncured underfill material 294 flows over the sides of semiconductor die 144. Underfill material 294 covers the outer parts of active surface 150 of semiconductor die 144, but not active region 154. Pressing semiconductor die 144 toward substrate 250 and into underfill material 294 may cause underfill material 294 to flow away from bumps 290. The outward flow of any underfill material 294 caused by mounting semiconductor die 144 is contained by trench 282 and insulating layer 284. The width of trench 282, i.e., the width of insulating layer 280 adjacent to opening 272, is selected to prevent underfill material 294 from flowing over the active region 154 of semiconductor die 144. Sidewall 283 of trench 282 blocks the flow of underfill material 194 and keeps underfill material 294 from blocking or contacting sensors 156 in active region 154. Sidewall 283 also blocks underfill material 294 from flowing into opening 272. Unblocked sensors 156 are able to react to external stimulus passing through opening 272. Sidewall 281 of trench 282 and sidewall 285 of insulating layer 284 block underfill material 294 from flowing over semiconductor die 124 or covering contact pads 260c.

Underfill material 294 is cured after semiconductor die 144 is attached to substrate 250. Cured underfill 294 extends from the sides of semiconductor die 144, over bumps 290, to surface 252 of substrate 250. Cured underfill 294 provides structural support and environmental isolation for semiconductor die 144.

Substrate 250, insulating layer 280, insulating layer 284, semiconductor die 144, semiconductor die 124, and cured underfill 294 form semiconductor die package 298. The location of underfill material 294 over substrate 250 in package 298 is easily and accurately controlled. The underfill dispenser has easy and complete access to die attach area 276, because semiconductor die 144 is mounted to substrate 250 after the underfill material 294 is deposited. Underfill 294 covers the outer parts of active surface 150 of semiconductor die 144, but not active region 154. Insulating layer 280 provides an underfill-retaining trench 222 around opening 272. Insulating layer 284 provides an additional barrier between the outer boundary of trench 282 and semiconductor die 124 and contact pads 260c. Trench 282 and insulating layer 284 contain the outward flow of underfill material 294. Sidewall 281 of trench 282 and sidewall 285 of insulating layer 284 prevent underfill material 294 from contacting semiconductor die 124 or covering contact pads 260c. Uncovered contact pads 260c are able to make unobstructed electrical connection between substrate 250 and external components. Sidewall 283 of trench 282 prevents underfill material 294 from flowing into opening 272 or blocking sensors 156. Opening 272 remains devoid of all material and unblocked sensors 156 are able receive external stimuli through opening 272. Underfill material 294 extends over the sides of semiconductor die 144 and fills the space between semiconductor die 144 and surface 252 of substrate 250. After curing, underfill material 294 provides structural support and environmental isolation for semiconductor die 144.

FIGS. 8a-8i illustrate, in relation to FIGS. 1 and 2a-2c, a process of forming an underfill-retaining trench surrounded by an insulating layer and a dam over a substrate to control the outward flow of excess underfill material, and disposing a semiconductor die over the underfill material. FIG. 8a shows an interposer or substrate 300 including a surface 302 and an opposing surface 304. Substrate 300 includes one or more insulating layers 306 and one or more conductive layers 308. Conductive layers 308 provide vertical and horizontal conduction paths through substrate 300. Portions of conductive layers 308 are electrically common or electrically isolated according to the design and function of the semiconductor die to be mounted to substrate 300.

A plurality of contact pads 310 is formed in surface 302 of substrate 300. Contact pads 310 are one or more layers of conductive material, such as Al, Cu, Sn, Ni, Au, or Ag, and are electrically connected to conductive layers 308 within substrate 300. Substrate 300 provides structural support and electrical interconnect through conductive layers 308 and contact pads 310.

One or more openings 312 are formed through substrate 300. Opening 312 extends completely through substrate 300 from surface 302 to surface 304. Opening 312 is completely devoid of any material and allows stimuli, e.g., light, to pass through substrate 300 and reach sensors on the active surface of the later mounted semiconductor die. Surface 302 of substrate 300 includes an area 316 around opening 312 and contact pads 310a designated for attaching a semiconductor die to contact pads 310a. Surface 302 also includes an area 318 outside the footprint of die attach area 316 designated for attaching a semiconductor die to contact pads 310b. Contact pads 310a are disposed around opening 312 within area 316. Contact pads 310b are disposed outside area 316, within area 318. Contact pads 310c are disposed outside of both area 316 and area 318.

In FIG. 8b, an insulating or passivation layer 320 is formed over surface 302 of substrate 300. Insulating layer 320 is formed using PVD, CVD, printing, spin coating, spray coating, sintering or thermal oxidation. Insulating layer 320 contains one or more layers of solder resist, SiO2, Si3N4, SiON, Ta2O5, Al2O3, HfO2, BCB, PI, PBO, polymer, or other material having similar structural and insulating properties.

A portion of insulating layer 320 is removed by LDA using an IR or UV laser to define an underfill-retaining trench 321 and expose contact pads 310a, contact pads 310b, and contact pads 310c. Trench 321 is formed around opening 212. Insulating layer 320 forms inner sidewall 323 and outer sidewall 325 of trench 321. Sidewall 323 of trench 321 forms a barrier between contact pads 310a and opening 312. Sidewall 325 of trench 321 forms a barrier between die attach area 316 and die attach area 318 and between contact pads 310a and 310c. Contact pads 310a are exposed in the floor of trench 321. Openings in insulating layer 320 also expose contact pads 310b and contact pads 310c. Alternatively, a portion of insulating layer 320 is removed by an etching process through a patterned photoresist layer to define trench 321 and expose contact pads 310b and contact pads 310c.

In FIG. 8c, an insulating or passivation layer 322 is formed over insulating layer 320. Insulating layer 322 is formed using PVD, CVD, printing, spin coating, spray coating, sintering or thermal oxidation. Insulating layer 322 contains one or more layers of solder resist, SiO2, Si3N4, SiON, Ta2O5, Al2O3, HfO2, BCB, PI, PBO, polymer, or other material having similar structural and insulating properties.

A portion of insulating layer 322 is removed by LDA using an IR or UV laser to expose insulating layer 320, trench 321, contact pads 310b, and contact pads 310c. Insulating layer 322 is formed around the outer boundary, i.e., sidewall 325, of trench 321. Insulating layer 322 forms an additional barrier between die attach area 316 and contact pads 310c and between die attach area 316 and die attach area 318. Openings in insulating layer 322 also expose contact pads 310b and insulating layer 320 in die attach area 318, and contact pads 310c. Alternatively, a portion of insulating layer 322 is removed by an etching process through a patterned photoresist layer to expose insulating layer 320, trench 321, contact pads 310b, and contact pads 310c. In one embodiment, insulating layer 320 and insulating layer 322 are removed at the same time.

In FIG. 8d, a dam 324 is formed over insulating layer 322 around trench 321. Dam 324 is a solder resist, adhesive, insulation, polymer, metal, or other suitable barrier material. Dam 324 is formed by screen printing, electrolytic plating, electroless plating, spray coating, or other suitable deposition process. FIG. 8e shows a plan view of dam 324 formed over insulating layer 322 around trench 321. Dam 324 provides a barrier (in addition to the barriers provided by trench 321 and insulating layer 322) between die attach area 316 and contact pads 310c and between die attach area 316 and die attach area 318.

In FIG. 8f, an electrically conductive bump material is deposited over contact pads 310a using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 310a using a suitable attachment or bonding process. In one embodiment, the bump material is reflowed by heating the material above the material's melting point to form balls or bumps 330. In some applications, bumps 330 are reflowed a second time to improve electrical connection to contact pads 310a. In one embodiment, bumps 330 are formed over a UBM having a wetting layer, barrier layer, and adhesive layer. Bumps 330 can also be compression bonded or thermocompression bonded to contact pads 310a. Bumps 330 represent one type of interconnect structure that can be formed over contact pads 310a. The interconnect structure can also use stud bump, micro bump, or other electrical interconnect.

Semiconductor die 124 from FIGS. 3a-3c is disposed over substrate 300 within die attach area 318. Semiconductor die 124 is mounted to substrate 300 by reflowing bumps 134 to metallurgically and electrically connect bumps 134 to contact pads 310b. Semiconductor die 124 is a KGD having been tested prior to mounting semiconductor die 124 to substrate 300. In one embodiment, semiconductor die 124 is an ASIC. Substrate 300 has sufficient size to accommodate multiple semiconductor die 124. Contact pads 310c are disposed outside the footprint of semiconductor die 124.

FIG. 8g shows a dispenser 334 depositing an underfill material 332. Underfill material 332 is deposited over bumps 330 in trench 321 using a paste printing, compressive molding, transfer molding, liquid encapsulant molding, vacuum lamination, spin coating, mold underfill, or other suitable application process. Underfill material 332 can be polymer composite material, such as epoxy resin with filler, epoxy acrylate with filler, or polymer with proper filler. Dispenser 334 has unfettered access to bumps 330, because no semiconductor die is present in area 316 when dispenser 334 deposits underfill material 332. The absence of a semiconductor die in area 316 allows underfill material 332 to be easily dispensed over bumps 330.

FIG. 8h shows uncured underfill material 332 disposed over bumps 330. Trench 321, insulating layer 322, and dam 324 contain any excess underfill material 332 flowing away from bumps 330. Inner sidewall 323 of trench 321 blocks any excess underfill material 332 from flowing into opening 312. Inner sidewall 323 keeps opening 312 completely devoid of any underfill material 332. Outer sidewall 325 of trench 321, insulating layer 322, and dam 324 block underfill material 332 from flowing over semiconductor die 124. Sidewall 325, insulating layer 322, and dam 324 also block underfill material 332 from covering contact pads 310c.

Contact pads 310c remain devoid of underfill material 332 and are able to make unobstructed electrical connection between substrate 300 and external components. In one embodiment, contact pads 310c are ground pads.

In FIG. 8i, a semiconductor die 144 from FIGS. 4a-4b is disposed over surface 302 of substrate 300 within area 316. Active region 154 is disposed over opening 312. Bumps 330 are reflowed and semiconductor die 144 is pressed toward substrate 300. Bumps 300 metallurgically and electrically connect conductive layer 152 of semiconductor die 144 to contact pads 310a. In some applications, bumps 330 are reflowed a second time to improve electrical contact to conductive layer 152. The uncured underfill material 332 flows over the sides of semiconductor die 144. Underfill material 332 covers the outer parts of active surface 150 of semiconductor die 144, but not active region 154. Pressing semiconductor die 144 toward substrate 300 and into underfill material 332 may cause underfill material 332 to flow away from bumps 330. The outward flow of any underfill material 332 caused by mounting semiconductor die 144 is contained by trench 321, insulating layer 322, and dam 324. The width of trench 321, i.e., the width of insulating layer 320 adjacent to opening 312, is selected to keep underfill material 332 from flowing over the active region 154 of semiconductor die 144. Sidewall 323 of trench 321 blocks the flow of underfill material 332 and keeps underfill material 332 from blocking or contacting sensors 156. Sidewall 323 also blocks underfill material 332 from flowing into opening 312. Unblocked sensors 156 in active region 154 are able to react to external stimulus passing through opening 312. Sidewall 325 of trench 321, insulating layer 322, and dam 324 block underfill material 332 from flowing over semiconductor die 124 or covering contact pads 310c.

Underfill material 332 is cured after semiconductor die 144 is attached to substrate 300. Cured underfill 332 extends from the sides of semiconductor die 144, over bumps 330, to surface 302 of substrate 300. Cured underfill 332 provides structural support and environmental isolation for semiconductor die 144.

Substrate 300, insulating layer 320, insulating layer 322, dam 324, semiconductor die 144, semiconductor die 124, and cured underfill 332 form semiconductor die package 340. The location of underfill material 332 over substrate 300 in package 340 is easily and accurately controlled. The underfill dispenser has easy and complete access to die attach area 316, because semiconductor die 144 is mounted to substrate 300 after the underfill material 332 is deposited. Underfill material 332 covers the outer parts of active surface 150 of semiconductor die 144, but not active region 154. Insulating layer 320 provides an underfill-retaining trench 321 around opening 312. Insulating layer 322 and dam 324 provide additional barriers between the outer boundary of trench 321 and semiconductor die 124 and contact pads 310c. Trench 321, insulating layer 322, and dam 324 contain the outward flow of underfill material 332. Sidewall 325 of trench 321, insulating layer 322, and dam 324 prevent underfill material 332 from contacting semiconductor die 124 or covering contact pads 310c. Uncovered contact pads 310c are able to make unobstructed electrical connection between substrate 300 and external components. Sidewall 323 of trench 321 prevents underfill material 332 from flowing into opening 312 or blocking sensors 156. Opening 312 remains devoid of all material and unblocked sensors 156 are able receive external stimuli through opening 312. Underfill material 332 extends over the sides of semiconductor die 144 and fills the space between semiconductor die 144 and surface 302 of substrate 300. After curing, underfill 332 provides structural support and environmental isolation for semiconductor die 144.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate including an opening devoid of material and extending from a first surface of the substrate to a second surface of the substrate;
    forming a first insulating layer over the first surface of the substrate;
    removing a portion of the first insulating layer to form a trench over the first surface of the substrate and around the opening;
    forming an interconnect structure in the trench;
    disposing an underfill material in the trench around the opening and interconnect structure; and
    disposing a first semiconductor die over the substrate and interconnect structure after depositing the underfill material in the trench, wherein a sensor of the first semiconductor die is disposed over the opening in the substrate and the trench contains the underfill material to prevent the underfill material from reaching the opening.

2. The method of claim 1, further including forming a second insulating layer over the first insulating layer.

3. The method of claim 2, further including forming a dam over the second insulating layer.

4. The method of claim 1, further including disposing a second semiconductor die over the substrate outside the trench.

5. A method of making a semiconductor device, comprising:
    providing a substrate including an opening devoid of material;
    forming a first insulating layer over the first surface of the substrate;
    forming a trench in the first insulating layer around the opening;
    forming an interconnect structure in the trench over the substrate;
    disposing an underfill material in the trench around the opening and interconnect structure; and
    disposing a first semiconductor die over the interconnect structure after depositing the underfill material in the trench, wherein a sensor of the first semiconductor die is disposed over the opening in the substrate and the trench contains the underfill material to prevent the underfill material from reaching the opening.

6. The method of claim 5, further including forming a second insulating layer over the first insulating layer.

7. The method of claim 5, further including curing the underfill material after disposing the semiconductor die over the underfill material.

8. A method of making a semiconductor device, comprising:
    providing a substrate including an opening;
    forming a trench over the substrate and around the opening;
    forming an interconnect structure in the trench over the substrate;
    disposing an underfill material in the trench; and disposing a first semiconductor die over the substrate with a first sidewall of the trench blocking flow of the underfill material into the opening in the substrate and a second sidewall of the trench blocking flow of the underfill material away from the opening in the substrate.

9. The method of claim 8, further including disposing a second semiconductor die over the substrate outside the trench.

10. The method of claim 8, further including disposing a sensor of the first semiconductor die over the opening in the substrate.

11. The method of claim 8, wherein forming the trench includes:
    forming a first insulating layer over the substrate; and
    forming the trench in the first insulating layer around the opening in the substrate.

12. A method of making a semiconductor device, comprising:
    providing a substrate;
    disposing a first insulating layer over the substrate;
    forming a trench in the first insulating layer around an opening in the substrate;
    disposing an underfill material in the trench over the substrate; and
    disposing a first semiconductor die over the opening in the substrate, wherein the trench contains the underfill material to prevent the underfill material from reaching the opening.

13. The method of claim 12, further including disposing a second semiconductor die over the substrate.

14. The method of claim 12, further including forming an interconnect structure in the trench over the substrate.

15. The method of claim 12, wherein the first semiconductor die includes a microelectromechanical device.

16. The method of claim 8, wherein the first semiconductor die includes a microelectromechanical device.

17. The method of claim 8, further including disposing the first semiconductor die over the substrate after depositing the underfill material in the trench.

18. The method of claim 11, further including forming a second insulating layer over the first insulating layer.

19. The method of claim 18, further including forming a dam over the second insulating layer.

20. The method of claim 1, wherein the sensor of the first semiconductor die includes a microelectromechanical device.

21. The method of claim 4, wherein the trench contains the underfill material to prevent the underfill material from reaching the second semiconductor die.

22. The method of claim 5, further including disposing a second semiconductor die over the substrate outside the trench.

23. The method of claim 22, wherein the trench contains the underfill material to prevent the underfill material from reaching the second semiconductor die.

24. The method of claim 5, wherein the sensor of the first semiconductor die includes a microelectromechanical device.

25. The method of claim 6, further including forming a dam over the second insulating layer.

26. The method of claim 12, further including disposing the first semiconductor die over the substrate after depositing the underfill material in the trench.

27. The method of claim 12, further including forming a second insulating layer over the first insulating layer.

28. The method of claim 27, further including forming a dam over the second insulating layer.

29. The method of claim 13, wherein the trench contains the underfill material to prevent the underfill material from reaching the second semiconductor die.

* * * * *